(12) United States Patent
Morishita

(10) Patent No.: US 12,635,415 B2
(45) Date of Patent: May 19, 2026

(54) PIEZOELECTRIC THIN FILM, PIEZOELECTRIC THIN FILM ELEMENT, AND PIEZOELECTRIC TRANSDUCER

(71) Applicant: TDK Corporation, Tokyo (JP)

(72) Inventor: Junpei Morishita, Tokyo (JP)

(73) Assignee: TDK Corporation, Tokyo (JP)

( * ) Notice: Subject to any disclaimer, the term of this patent is extended or adjusted under 35 U.S.C. 154(b) by 937 days.

(21) Appl. No.: 17/875,623

(22) Filed: Jul. 28, 2022

(65) Prior Publication Data

US 2023/0055097 A1 Feb. 23, 2023

(30) Foreign Application Priority Data

Aug. 6, 2021 (JP) ................................. 2021-129655

(51) Int. Cl.
*H10N 30/00* (2023.01)
*H10N 30/074* (2023.01)
*H10N 30/20* (2023.01)

(52) U.S. Cl.
CPC ......... *H10N 30/708* (2024.05); *H10N 30/074* (2023.02); *H10N 30/2047* (2023.02)

(58) Field of Classification Search
CPC ............... H10N 30/708; H10N 30/074; H10N 30/2047; H10N 30/076; H10N 30/079; H10N 30/8561; H10N 30/853; H10N 30/8536; H03H 9/02031
USPC ................................................. 310/357, 358
See application file for complete search history.

(56) References Cited

U.S. PATENT DOCUMENTS

2020/0227621 A1* 7/2020 Morishita ............ H10N 30/708
2022/0367785 A1* 11/2022 Morishita ............ H10N 30/708

FOREIGN PATENT DOCUMENTS

JP 2008-192868 A 8/2008
WO 2018/216225 A1 11/2018

OTHER PUBLICATIONS

Y. Kawahara, et al., "Control of Crystal Structure of BiFeO₃ Epitaxial Thin Films by Adjusting Growth Conditions and Piezo-electric Properties," Japanese Journal of Applied Physics, 51(2012), Sep. 20, 2012, p. 09LB04-1-p. 09LB04-5.
Kanno Isaku et al., "Crystallographic characterization of epitaxial Pb(Zr, Ti)O3 films with different Zr/Ti ratio grown by 1 radio-frequency-magnetron sputtering," Journal of Applied Physics, vol. 93, No. 7, 2003, p. 4091-p. 4096.

* cited by examiner

*Primary Examiner* — Julio C. Gonzalez
(74) *Attorney, Agent, or Firm* — Faegre Drinker Biddle & Reath LLP

(57) ABSTRACT

A piezoelectric thin film contains a lower layer and a first piezoelectric layer stacked on the lower layer. The first piezoelectric layer contains a tetragonal crystal 1 of a perovskite-type oxide. A (001) plane of the tetragonal crystal 1 is oriented in a normal direction dn of a surface of the first piezoelectric layer. A spacing of (100) planes of the tetragonal crystal 1 is a1. A spacing of (100) planes of a crystal contained in the lower layer is aL. A lattice mismatch rate between the first piezoelectric layer and the lower layer is 100×(aL−a1)/a1. The lattice mismatch rate is 3.0 to 12.1%. A rocking curve of diffracted X-rays of the (001) plane of the tetragonal crystal 1 is measured in an out-of-plane direction of the surface of the first piezoelectric layer. A FWHM of the rocking curve is 1.9 to 5.5°.

19 Claims, 11 Drawing Sheets

PIEZOELECTRIC THIN FILM, PIEZOELECTRIC THIN FILM ELEMENT, AND PIEZOELECTRIC TRANSDUCER

TECHNICAL FIELD

The present disclosure relates to a piezoelectric thin film, a piezoelectric thin film element (piezoelectric thin film device), and a piezoelectric transducer.

BACKGROUND

A piezoelectric material is processed into various piezoelectric elements for various purposes of use. For example, a piezoelectric actuator converts a voltage into a force by an inverse piezoelectric effect that deforms a piezoelectric material by applying a voltage to the piezoelectric material. Furthermore, a piezoelectric sensor converts a force into a voltage by a piezoelectric effect that deforms a piezoelectric material by applying a pressure to the piezoelectric material to cause electric polarization. These piezoelectric elements are mounted on various electronic devices.

In recent years, in the market, miniaturization and improvement in performance of electronic devices are demanded, and thus a piezoelectric element using a piezoelectric thin film (piezoelectric thin film element) has been studied actively. However, since it is difficult to obtain a piezoelectric effect and an inverse piezoelectric effect as the thickness of a piezoelectric material decreases, development of a piezoelectric material having excellent piezoelectric properties in a thin film state has been expected.

Conventionally, as a piezoelectric material, lead zirconate titanate (so-called PZT) that is a perovskite-type ferroelectric material has been used frequently (see Japanese Unexamined Patent Publication No. 2008-192868). However, since PZT contains lead (Pb) that harms the environment and human body, development of a lead-free piezoelectric material as an alternative to PZT has been expected. For example, in Y. Kawahara et al, Control of Crystal Structure of $BiFeO_3$ Epitaxial Thin Films by Adjusting Growth Conditions and Piezoelectric Properties, Japanese Journal of Applied Physics. 51 (2012) 09LB04, $BiFeO_3$ is described as an example of lead-free piezoelectric materials. $BiFeO_3$ has relatively excellent piezoelectric properties among lead-free piezoelectric materials, and thus is expected to be applied particularly to a piezoelectric thin film element.

SUMMARY

Main indices (piezoelectric constants) showing the performance of the piezoelectric material are $d_{33,f}$ (piezoelectric strain constant) and $g_{33}$ (piezoelectric output constant). The piezoelectric strain constant $d_{33,f}$ (unit: pC/N) is an index of the strain amount per unit electric field (signal sending ability). As the piezoelectric strain constant $d_{33,f}$ increases, the performance of the piezoelectric material as an actuator is improved. Meanwhile, the piezoelectric output constant $g_{33}$ (unit: $\times 10^{-3}$ V·m/N) is an index of the strength of electric field generated per unit stress (signal receiving ability). As the piezoelectric output constant $g_{33}$ increases, the performance of the piezoelectric material as a sensor such as a transducer is improved. $g_{33}$ is represented as $d_{33,f}/\varepsilon_r\varepsilon_0$ or $d_{33,f}/\varepsilon_{33}\varepsilon_0$. $\varepsilon_r$ or $\varepsilon_{33}$ is a relative permittivity (unit: none) of the piezoelectric material. $\varepsilon_0$ is a permittivity of vacuum ($8.854 \times 10^{-12}$ $Fm^{-1}$). $d_{33,f}/\varepsilon_r\varepsilon_0$ is described as "piezoelectric performance index". The piezoelectric performance index increases with an increase in $d_{33,f}$ and the piezoelectric performance index increases with a decrease in $\varepsilon_r$. That is, the piezoelectric performance index ($d_{33,f}/\varepsilon_r\varepsilon_0$) is increased by achieving both of a large piezoelectric strain constant $d_{33,f}$ and a low relative permittivity $\varepsilon_r$.

An object of an aspect of the present invention is to provide a piezoelectric thin film having a large piezoelectric performance index ($d_{33,f}/\varepsilon_r\varepsilon_0$), a piezoelectric thin film element containing this piezoelectric thin film, and a piezoelectric transducer containing this piezoelectric thin film element.

A piezoelectric thin film according to an aspect of the present invention contains a lower layer and a first piezoelectric layer directly or indirectly stacked on the lower layer. The first piezoelectric layer contains a tetragonal crystal 1 of a perovskite-type oxide. A (001) plane of the tetragonal crystal 1 is oriented in a normal direction of a surface of the first piezoelectric layer. ((001) planes of the tetragonal crystal 1 may be oriented in the normal direction of the surface of the first piezoelectric layer.) A spacing of (100) planes of the tetragonal crystal 1 is a1. A spacing of (100) planes of a crystal contained in the lower layer is aL. A lattice mismatch rate between the first piezoelectric layer and the lower layer is defined as $100 \times (aL - a1)/a1$. The lattice mismatch rate is from 3.0% to 12.1%. A rocking curve of diffracted X-rays of the (001) plane(s) of the tetragonal crystal 1 is measured in an out-of-plane direction of the surface of the first piezoelectric layer. A full width at half maximum (FWHM) of the rocking curve is from 1.9° to 5.5°.

The aL may be from 3.92 Å to 4.29 Å.

A (001) plane ((001) planes) of the crystal contained in the lower layer may be oriented in the normal direction of the surface of the first piezoelectric layer.

The crystal contained in the lower layer may be at least one crystal selected from the group consisting of a cubic crystal, a tetragonal crystal, a rhombohedral crystal, a pseudo-cubic crystal, and a pseudo-tetragonal crystal.

The crystal contained in the lower layer may contain at least one compound of barium titanate and titanium nitride.

A thickness of the lower layer may be from 10 nm to 350 nm.

A spacing of the (001) planes of the tetragonal crystal 1 is c1. c1/a1 may be from 1.050 to 1.250.

The tetragonal crystal 1 may contain bismuth, iron, an element $E^B$, and oxygen. The element $E^B$ may be at least one element selected from the group consisting of magnesium, aluminum, zirconium, titanium, nickel, and zinc.

The tetragonal crystal 1 may be represented by Chemical Formula 1 below. $E^A$ in Chemical Formula 1 below may be at least one element selected from the group consisting of Na, K, and Ag. $E^B$ in Chemical Formula 1 below may be at least one element selected from the group consisting of Mg, Al, Zr, Ti, Ni, and Zn. x1 in Chemical Formula 1 below may be from 0.10 to 0.90. y1 in Chemical Formula 1 below may be from 0.05 to 0.85. z1 in Chemical Formula 1 below may be from 0.05 to 0.85. x1+y1+z1 may be 1.00. a in Chemical Formula 1 below may be 0.00 or more and less than 1.00.

$$x1(Bi_{1-a}E^A_a)E^BO_3 - y1BiFeO_3 - z1Bi(Fe_{0.5}Ti_{0.5})O_3 \qquad (1)$$

The piezoelectric thin film may contain a second piezoelectric layer. The second piezoelectric layer may be disposed between the lower layer and the first piezoelectric layer. The second piezoelectric layer may contain a tetragonal crystal 2 of a perovskite-type oxide. A (001) plane ((001) planes) of the tetragonal crystal 2 may be oriented in the normal direction of the surface of the first piezoelectric layer, A spacing of the (001) planes of the tetragonal crystal 1 is c1. A spacing of the (001) planes of the tetragonal crystal 2 is c2. A spacing of (100) planes of the tetragonal crystal 2 is a2. c2/a2 may be smaller than c1/a1.

The c2/a2 may be from 1.010 to 1.110.

A peak intensity of diffracted X-rays of the (001) plane(s) of the tetragonal crystal 1 is $I_1$. A peak intensity of diffracted X-rays of the (001) plane(s) of the tetragonal crystal 2 is $I_2$. $I_1/(I_1+I_2)$ may be 0.90 or more and less than 1.00.

The tetragonal crystal 2 may contain bismuth, iron, an element $E^B$, and oxygen. The element $E^B$ may be at least one element selected from the group consisting of magnesium, aluminum, zirconium, titanium, nickel, and zinc.

The tetragonal crystal 2 may be represented by Chemical Formula 2 below. $E^A$ in Chemical Formula 2 below may be at least one element selected from the group consisting of Na, K, and Ag. $E^B$ in Chemical Formula 2 below may be at least one element selected from the group consisting of Mg, Al, Zr, Ti, Ni, and Zn. x2 in Chemical Formula 2 below may be from 0.10 to 0.85. y2 in Chemical Formula 2 below may be from 0.10 to 0.85. z2 in Chemical Formula 2 below may be from 0.05 to 0.80. x2+y2+z2 may be 1.00. a in Chemical Formula 2 below may be 0.00 or more and less than 1.00.

$$x2(Bi_{1-\alpha}E^A{}_\alpha)E^B O_3 - y2BiFeO_3 - z2Bi(Fe_{0.5}Ti_{0.5})O_3 \qquad (2)$$

A thickness of the second piezoelectric layer may be from 10 nm to 300 nm.

A piezoelectric thin film element (piezoelectric thin film device) according to an aspect of the present invention contains the above-described piezoelectric thin film.

The piezoelectric thin film element may contain a crystalline substrate and an electrode layer stacked on the crystalline substrate. The lower layer may be directly stacked on the electrode layer. An intermediate layer may be disposed between the crystalline substrate and the electrode layer. The intermediate layer may contain $ZrO_2$ and $Y_2O_3$.

The piezoelectric thin film element may contain an electrode layer. The lower layer may be directly stacked on the electrode layer. The electrode layer may contain a platinum crystal. A (002) plane ((002) planes) of the platinum crystal may be oriented in a normal direction of a surface of the electrode layer. A (200) plane ((200) planes) of the platinum crystal may be oriented in an in-plane direction of the surface of the electrode layer.

A piezoelectric transducer according to an aspect of the present invention contains the above-described piezoelectric thin film element.

According to an aspect of the present invention, there are provided a piezoelectric thin film having a large piezoelectric performance index ($d_{33,f}/\varepsilon_r\varepsilon_0$), a piezoelectric thin film element containing this piezoelectric thin film, and a piezoelectric transducer containing this piezoelectric thin film element.

DETAILED DESCRIPTION

Figure 1A:
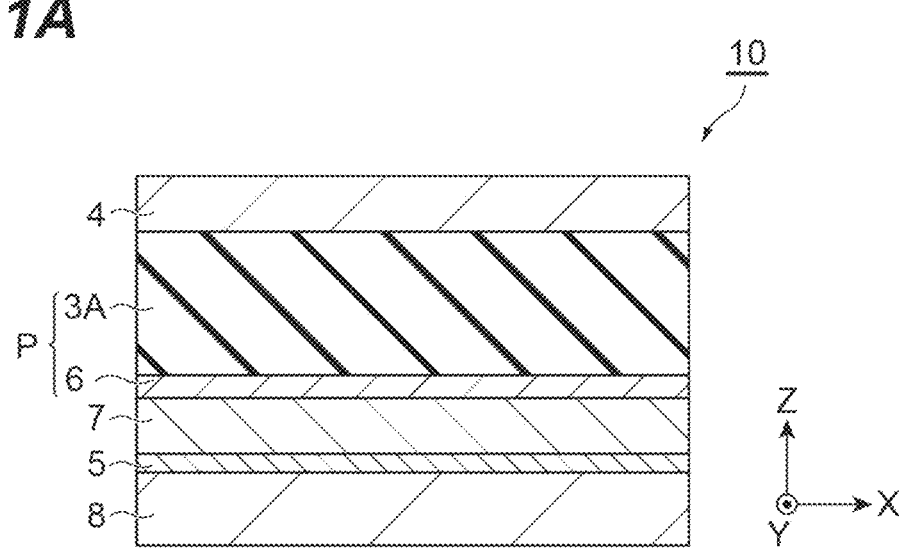
FIG. 1A is a schematic cross-sectional view of a piezoelectric thin film element according to an embodiment of the present invention.

Hereinafter, details of preferred embodiments of the present invention will be described with reference to the drawings. However, the present invention is not limited to the following embodiments. In the drawings, the same or equivalent elements are designated by the same reference numerals. X, Y and Z axes shown in FIG. 1A, FIG. 1B, FIG. 4, FIG. 6, and FIG. 9 are three coordinate axes orthogonal to one another. The direction of each of the three coordinate axes is common to FIG. 1A. FIG. 1B, FIG. 4, FIG. 6, and FIG. 9.

Figure 1B:
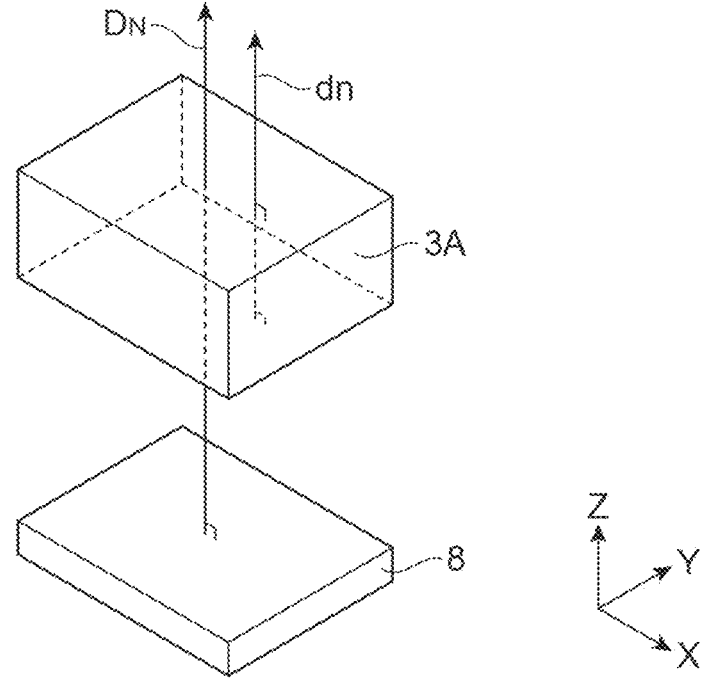
FIG. 1B is an exploded perspective view of the piezoelectric thin film element in FIG. 1A.

A piezoelectric thin film element according to the present embodiment contains a piezoelectric thin film. FIG. 1A is a cross-sectional view of a piezoelectric thin film element 10 according to the present embodiment, and FIG. 1B is an exploded perspective view of the piezoelectric thin film element 10. The cross-section of this piezoelectric thin film element 10 is perpendicular to a surface of a piezoelectric thin film P. The piezoelectric thin film element 10 contains a crystalline substrate 8, a first electrode layer 7 (lower electrode layer) directly or indirectly stacked on the crystalline substrate 8, a piezoelectric thin film P directly stacked on the first electrode layer 7, and a second electrode layer 4 (upper electrode layer) directly or indirectly stacked on the piezoelectric thin film P. The piezoelectric thin film P contains a lower layer 6 directly stacked on the first electrode layer 7 and a first piezoelectric layer 3A directly or indirectly stacked on the lower layer 6. The piezoelectric thin film element 10 may further contain an intermediate layer 5. The intermediate layer 5 may be disposed between the crystalline substrate 8 and the first electrode layer 7, and the first electrode layer 7 may be directly stacked on a surface of the intermediate layer 5. As illustrated in FIG. 1B, a normal direction dn of a surface of the first piezoelectric layer 3A may be substantially parallel to a normal direction $D_N$ of a surface of the crystalline substrate 8. The normal direction dn of the surface of the first piezoelectric layer 3A may be restated as a thickness direction of the piezoelectric thin film P. In the exploded perspective view of the piezoelectric thin film element 10 illustrated in FIG. 1B, the intermediate layer 5, the first electrode layer 7, the lower layer 6, and the second electrode layer 4 are omitted.

A modification example of the piezoelectric thin film element 10 does not have to contain the crystalline substrate 8. For example, the crystalline substrate 8 may be removed after the formation of the first electrode layer 7 and the piezoelectric thin film P. A modification example of the piezoelectric thin film element 10 does not have to contain the second electrode layer 4. For example, a piezoelectric thin film element not containing a second electrode layer may be supplied as a product to a manufacturer of an electronic device, and then the second electrode layer may be added to the piezoelectric thin film element in the manufacturing process of the electronic device. In a case where the crystalline substrate 8 functions as an electrode, a modification example of the piezoelectric thin film element 10 does not have to contain the first electrode layer 7. That is, the modification example of the piezoelectric thin film element 10 may contain the crystalline substrate 8 and the piezoelectric thin film P stacked on the crystalline substrate 8. In a case where the first electrode layer 7 does not exist, the lower layer 6 contained in the piezoelectric thin film P may be directly stacked on the crystalline substrate 8. In a case where the first electrode layer 7 does not exist, the lower layer 6 contained in the piezoelectric thin film P may be stacked on the crystalline substrate 8 with the intermediate layer 5 interposed therebetween.

The piezoelectric thin film P may further contain a second piezoelectric layer 3B in addition to the lower layer 6 and the first piezoelectric layer 3A. The piezoelectric thin film P may consist of the lower layer 6, the first piezoelectric layer 3A, and the second piezoelectric layer 3B. In a case where the piezoelectric thin film P contains the second piezoelectric layer 3B, the second piezoelectric layer 3B is disposed between the lower layer 6 and the first piezoelectric layer 3A. For example, the piezoelectric thin film P contained in a piezoelectric thin film element 10a illustrated in FIG. 6 contains the lower layer 6 directly stacked on the first electrode layer 7, the second piezoelectric layer 3B directly stacked on the lower layer 6, and the first piezoelectric layer 3A directly stacked on the second piezoelectric layer 3B. However, the second piezoelectric layer 3B is not essential for the piezoelectric thin film P, and the piezoelectric thin film P does not have to contain the second piezoelectric layer 3B. For example, the piezoelectric thin film P may consist of the lower layer 6 and the first piezoelectric layer 3A.

The first piezoelectric layer 3A contains a tetragonal crystal 1 of a perovskite-type oxide. Needless to say, the perovskite-type oxide is an oxide having a perovskite-type structure. The perovskite-type oxide is a main component of the first piezoelectric layer 3A. The total content rate of elements constituting the perovskite-type oxide in the first piezoelectric layer 3A may be from 99 mol % to 100 mol %. The tetragonal crystal 1 may be a single crystal or a polycrystal.

The second piezoelectric layer 3B contains a tetragonal crystal 2 of a perovskite-type oxide. The perovskite-type oxide is a main component of each second piezoelectric layer 3B. The total content rate of elements constituting the perovskite-type oxide in the second piezoelectric layer 3B may be from 99 mol % to 100 mol %. The tetragonal crystal 2 may be a single crystal or a polycrystal.

The first piezoelectric layer 3A may consist of the tetragonal crystal 1. The first piezoelectric layer 3A does not have to contain the tetragonal crystal 2. The first piezoelectric layer 3A may contain a trace amount of the tetragonal crystal 2. The second piezoelectric layer 3B may consist of the tetragonal crystal 2. The second piezoelectric layer 3B does not have to contain the tetragonal crystal 1. The second piezoelectric layer 3B may contain a trace amount of the tetragonal crystal 1.

The first piezoelectric layer 3A may contain a trace amount of a crystal other than the tetragonal crystal, in addition to the tetragonal crystal 1. The second piezoelectric layer 3B may also contain a trace amount of a crystal other than the tetragonal crystal, in addition to the tetragonal crystal 2. For example, a trace amount of crystal other than the tetragonal crystal may be at least one crystal of a perovskite-type oxide selected from the group consisting of a cubic crystal, a rhombohedral crystal, a pseudo-cubic crystal, and a pseudo-tetragonal crystal.

The lower layer 6 contains a crystal. For example, the crystal contained in the lower layer 6 may be at least one crystal selected from the group consisting of a cubic crystal, a tetragonal crystal, a rhombohedral crystal, a pseudo-cubic crystal, and a pseudo-tetragonal crystal. The crystal contained in the lower layer 6 may be a single crystal or a polycrystal. The lower layer 6 may consist of the crystal.

The tetragonal crystal 1 may contain bismuth (Bi), iron (Fe), an element $E^B$, and oxygen (O). The element $E^B$ contained in the tetragonal crystal 1 may be at least one element selected from the group consisting of magnesium (Mg), aluminum (Al), zirconium (Zr), titanium (Ti), nickel (Ni), and zinc (Zn). The tetragonal crystal 1 may contain a plurality of $E^B$'s. The tetragonal crystal 1 may further contain an element $E^A$ in addition to Bi, Fe, $E^B$, and O. The element $E^A$ contained in the tetragonal crystal 1 may be at least one element selected from the group consisting of sodium (Na), potassium (K), and silver (Ag). The tetragonal crystal 1 may contain a plurality of $E^A$'s.

The tetragonal crystal 2 may also contain bismuth, iron, an element $E^B$, and oxygen. The element $E^B$ contained in the tetragonal crystal 2 may also be at least one element selected from the group consisting of magnesium, aluminum, zirconium, titanium, nickel, and zinc. The tetragonal crystal 2 may also further contain an element $E^A$ in addition to Bi, Fe, $E^B$, and O. The tetragonal crystal 2 may also contain a plurality of $E^B$'s. The element $E^A$ contained in the tetragonal crystal 2 may also be at least one element selected from the group consisting of sodium, potassium, and silver. The tetragonal crystal 2 may also contain a plurality of $E^A$'s.

The composition of the tetragonal crystal 1 may be the same as the composition of the tetragonal crystal 2. The composition of the tetragonal crystal 1 may be different from the composition of the tetragonal crystal 2. Each of the tetragonal crystal 1 and the tetragonal crystal 2 may further contain elements other than Bi, Fe, $E^A$, $E^B$, and O. Each of the tetragonal crystal 1 and the tetragonal crystal 2 does not have to contain Pb. Each of the tetragonal crystal 1 and the tetragonal crystal 2 may contain Pb. Each of the tetragonal crystal 1 and the tetragonal crystal 2 may contain both of $Fe^{2+}$ (divalent iron) and $Fe^{3+}$ (trivalent iron) as iron. Each of the tetragonal crystal 1 and the tetragonal crystal 2 may contain only $Fe^{3+}$ (trivalent iron) as iron.

Figure 2:
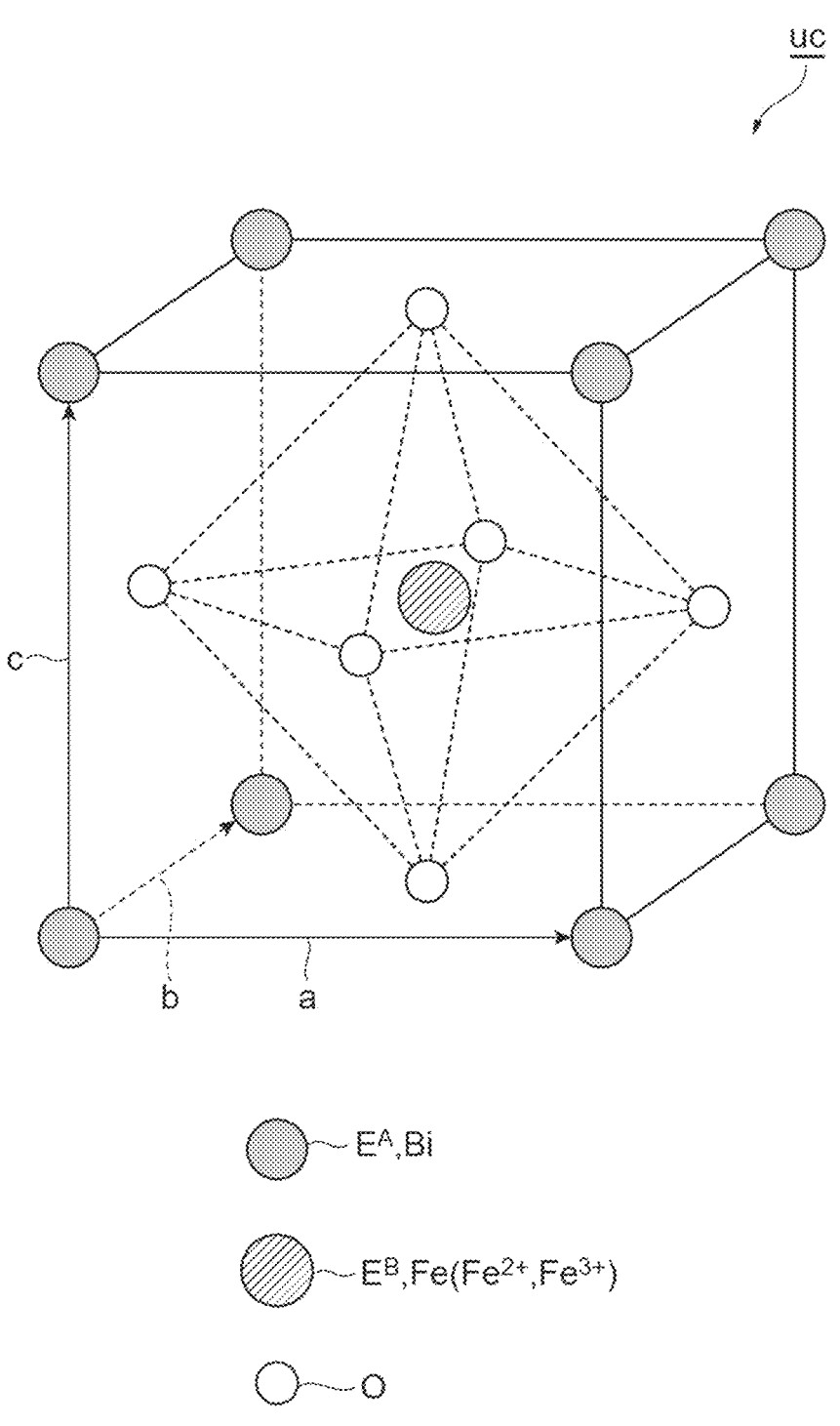
FIG. 2 is a perspective view of a unit cell of a perovskite-type structure (perovskite-type oxide).

FIG. 2 illustrates a unit cell uc of a perovskite-type oxide. Each of a, b, and c in FIG. 2 is a primitive lattice vector of the perovskite structure. An element located in the A site of the unit cell uc may be Bi or $E^A$. An element located in the B site of the unit cell uc may be Fe or $E^B$. Some of Fe located in the B site may be divalent iron ($Fe^{2+}$), and the remainder of Fe located in the B site may be trivalent iron ($Fe^{3+}$). Fe located in the B site may be only trivalent iron ($Fe^{3+}$).

Figures 3A, 3B:
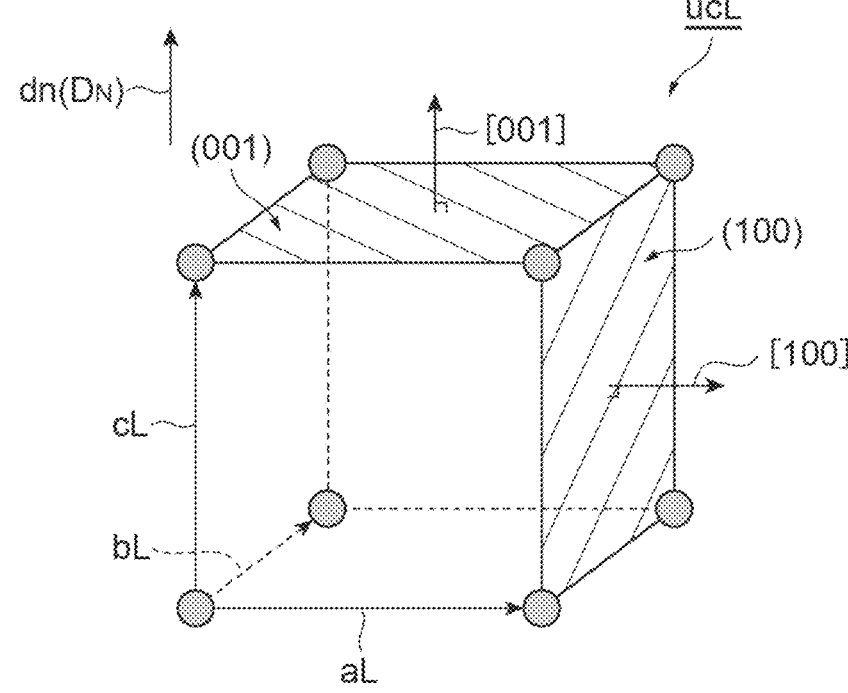
FIG. 3A is a schematic perspective view of a unit cell of a tetragonal crystal 1 contained in a first piezoelectric layer.
FIG. 3B is a schematic perspective view of a unit cell of a crystal contained in a lower layer.

FIG. 3A illustrates a unit cell uc1 of the tetragonal crystal 1, and FIG. 3B illustrates a unit cell ucL of the crystal contained in the lower layer 6. For the sake of convenience of illustration, $E^B$ and O (oxygen) constituting the unit cell uc1 in FIG. 3A are omitted, but the unit cell uc1 in FIG. 3A has the same perovskite structure as that of the unit cell uc in FIG. 2. The crystal contained in the lower layer 6 is described as "lower crystal 6c".

Each of a1, b1, and c1 in FIG. 3A is a primitive lattice vector of the tetragonal crystal 1. The vector a1 in FIG. 3A corresponds to the vector a in FIG. 2. The vector b1 in FIG. 3A corresponds to the vector b in FIG. 2. The vector c1 in FIG. 3A corresponds to the vector c in FIG. 2. a1, b1, and c1 are perpendicular to one another. The orientation of the vector a1 (a axis) is [100]. The orientation of the vector b1 (b axis) is [010]. The orientation of the vector c1 (c axis) is [001]. A length a1 of the vector a1 is a spacing of (100) planes of the tetragonal crystal 1 (that is, a lattice constant in the [100] direction). A length b1 of the vector b1 is a spacing of (010) planes of the tetragonal crystal 1 (that is, a lattice constant in the [010] direction). A length c1 of the vector c1 is a spacing of the (001) planes of the tetragonal crystal 1 (that is, a lattice constant in the [001] direction). The length a1 is equal to the length b1. The length c1 is larger than the length a1.

Each of aL, bL, and cL in FIG. 3B is a primitive lattice vector of the lower crystal 6c. aL, bL, and cL may be perpendicular to one another. aL, bL, and cL does not have to be perpendicular to one another. The orientation of the vector aL (a axis) is [100]. The orientation of the vector bL (b axis) is [010]. The orientation of the vector cL (c axis) is [001]. A length aL of the vector aL is a spacing of (100) planes of the lower crystal 6c (that is, a lattice constant in the [100] direction). A length bL of the vector bL is a spacing of (010) planes of the lower crystal 6c (that is, a lattice constant in the [010] direction). A length cL of the vector cL is a spacing of (001) planes of the lower crystal 6c (that is, a lattice constant in the [001] direction).

Figures 7A, 7B:
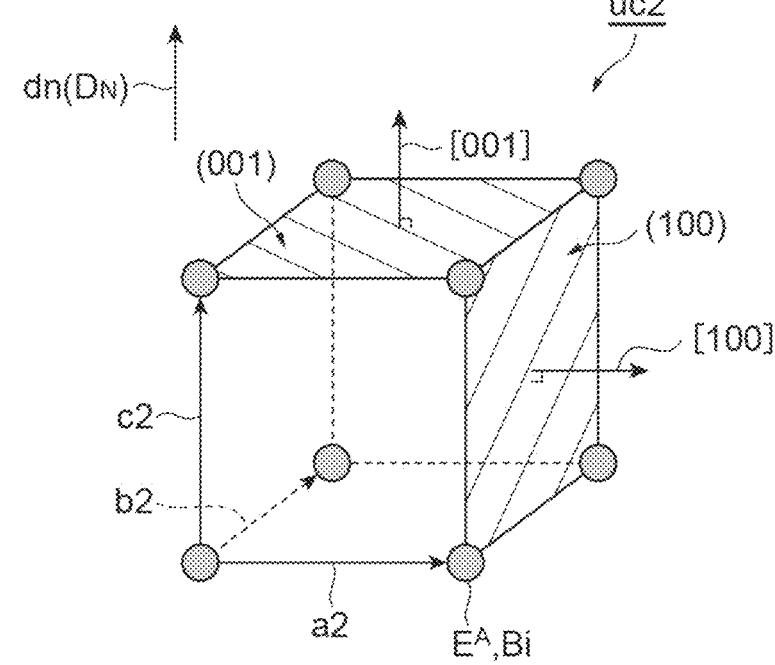
FIG. 7A is a schematic perspective view of the unit cell of the tetragonal crystal 1 contained in the first piezoelectric layer.
FIG. 7B is a schematic perspective view of a unit cell of a tetragonal crystal 2 contained in a second piezoelectric layer.

FIG. 7A illustrates the unit cell uc1 of the tetragonal crystal 1, and FIG. 7B illustrates a unit cell uc2 of the tetragonal crystal 2. For the sake of convenience of illustration, $E^B$ and O (oxygen) constituting the unit cell uc2 in FIG. 7B are omitted, but the unit cell uc2 in FIG. 7B has the same perovskite structure as that of the unit cell uc in FIG. 2. The unit cell uc1 in FIG. 7A is the same as the unit cell uc1 in FIG. 3A.

Each of a2, b2, and c2 in FIG. 7B is a primitive lattice vector of the tetragonal crystal 2. The vector a2 in FIG. 7B corresponds to the vector a in FIG. 2. The vector b2 in FIG. 7B corresponds to the vector b in FIG. 2. The vector c2 in FIG. 7B corresponds to the vector c in FIG. 2. a2, b2, and c2 are perpendicular to one another. The orientation of the vector a2 (a axis) is [100]. The orientation of the vector b2 (b axis) is [010]. The orientation of the vector c2 (c axis) is [001]. A length a2 of the vector a2 is a spacing of (100) planes of the tetragonal crystal 2 (that is, a lattice constant in the [100] direction). A length b2 of the vector b2 is a spacing of (010) planes of the tetragonal crystal 2 (that is, a lattice constant in the [010] direction). A length c2 of the vector c2 is a spacing of the (001) planes of the tetragonal crystal 2 (that is, a lattice constant in the [001] direction). The length a2 is equal to the length b2. The length c2 is larger than the length a2.

As illustrated in FIG. 1B, FIG. 3A, and FIG. 7A, the (001) plane of the tetragonal crystal 1 (unit cell uc1) is oriented in the normal direction dn of the surface of the first piezoelectric layer 3A. As illustrated in FIG. 1B and FIG. 7B, the (001) plane of the tetragonal crystal 2 (unit cell uc2) is also oriented in the normal direction dn of the surface of the first piezoelectric layer 3A. For example, each of the (001) plane of the tetragonal crystal 1 and the (001) plane of the tetragonal crystal 2 may be substantially parallel to the surface of the first piezoelectric layer 3A, and the [001] direction of each of the tetragonal crystal 1 and the tetragonal crystal 2 may be substantially parallel to the normal direction dn of the surface of the first piezoelectric layer 3A. The (001) plane of the tetragonal crystal 1 may be oriented in the normal direction $D_N$ of the surface of the crystalline substrate 8. The (001) plane of the tetragonal crystal 2 may also be oriented in the normal direction $D_N$ of the surface of the crystalline substrate 8. In other words, each of the (001) plane of the tetragonal crystal 1 and the (001) plane of the tetragonal crystal 2 may be substantially parallel to the surface of the crystalline substrate 8, and the [001] direction of each of the tetragonal crystal 1 and the tetragonal crystal 2 may be substantially parallel to the normal direction $D_N$ of the surface of the crystalline substrate 8.

A tetragonal crystal of a perovskite-type oxide is likely to be polarized in the [001] direction. That is, [001] is an orientation in which a tetragonal crystal of a perovskite-type oxide is likely to be polarized as compared to other crystal orientations. Therefore, each of the (001) plane of the tetragonal crystal 1 and the (001) plane of the tetragonal crystal 2 is oriented in the normal direction dn of the surface of the first piezoelectric layer 3A, and thus the piezoelectric thin film P can have excellent piezoelectric properties. From the same reason, the piezoelectric thin film P may be a ferroelectric material. In a case where the piezoelectric thin film P contains only the first piezoelectric layer 3A among the first piezoelectric layer 3A and the second piezoelectric layer 3B, "crystalline orientation" described below means that the (001) plane of the tetragonal crystal 1 is oriented in the normal direction dn of the surface of the first piezoelectric layer 3A. In a case where the piezoelectric thin film P contains both the first piezoelectric layer 3A and the second piezoelectric layer 3B, "crystalline orientation" described below means that each of the (001) plane of the tetragonal crystal 1 and the (001) plane of the tetragonal crystal 2 is oriented in the normal direction dn of the surface of the first piezoelectric layer 3A.

When the piezoelectric thin film P has the above-described crystalline orientation, the piezoelectric thin film P can have a large piezoelectric performance index ($d_{33,f}/\varepsilon_r\varepsilon_0$). The above-described crystalline orientation is a particular feature of a thin film. A thin film is a crystalline film formed by a vapor deposition method, a solution method, or the like. On the other hand, a bulk of the piezoelectric material having the same composition as that of the piezoelectric thin film P is difficult to have the above-described crystalline orientation. This is because the bulk of the piezoelectric material is a sintered material (ceramic material) made from a powder containing essential element of the piezoelectric material, and the structure and orientation of numerous crystals constituting the sintered material are difficult to be controlled. Since the bulk of the piezoelectric material contains an element such as Fe, a specific resistivity of the bulk of the piezoelectric material is lower than that of the piezoelectric thin film P. As a result, a leakage current is easy to occur in the bulk of the piezoelectric material. Therefore, it is difficult to polarize the bulk of the piezoelectric material by applying a high electric field, and it is difficult for the bulk of the piezoelectric material to have a large piezoelectric performance index.

As described above, the spacing of the (100) planes of the tetragonal crystal 1 is a1, and the spacing of the (100) planes of the crystal (lower crystal 6c) contained in the lower layer 6 is aL. aL is larger than a1. A lattice mismatch rate Δa between the first piezoelectric layer 3A and the lower layer 6 is defined as 100×(aL−a1)/a1. The lattice mismatch rate Δa is from 3.0% to 12.1% or from 3.01% to 12.03%. That is, 100×(aL−a1)/a1 is from 3.0 to 12.1 or from 3.01 to 12.03. A rocking curve RC of diffracted X-rays of the (001) plane of the tetragonal crystal 1 is measured in an out-of-plane direction of the surface of the first piezoelectric layer 3A. The full width at half maximum (FWHM) of the rocking curve RC is from 1.9° to 5.5°.

In a case where the lattice mismatch rate Δa is within the above range, the FWHM of the rocking curve RC is easily controlled within the above range. In a case where the lattice mismatch rate Δa is less than 3.0%, the FWHM of the rocking curve RC tends to be less than 1.9°. In a case where the lattice mismatch rate Δa is more than 12.1%, the FWHM of the rocking curve RC tends to be more than 5.5°. Since a1 depends on the composition and crystalline structure of the first piezoelectric layer 3A and aL depends on the composition and crystalline structure of the lower layer 6, the lattice mismatch rate Δa may be controlled by selection and combination of the composition and crystalline structure of each of the first piezoelectric layer 3A and the lower layer 6.

When the FWHM of the rocking curve RC is from 1.9° to 5.5°, the piezoelectric thin film P can have a large piezoelectric performance index $(d_{33,f}/\varepsilon_r\varepsilon_0)$. That is, when the FWHM of the rocking curve RC is from 1.9° to 5.5°, both of a large piezoelectric strain constant $d_{33,f}$ of the piezoelectric thin film P and a low relative permittivity $\varepsilon_r$ of the piezoelectric thin film P can be achieved.

For example, the piezoelectric performance index $(d_{33,f}/\varepsilon_r\varepsilon_0)$ of the piezoelectric thin film P may be from $150×10^{-3}$ V·m/N to $239×10^{-3}$ V·m/N or from $155×10^{-3}$ V·m/N to $222×10^{-3}$ V·m/N.

For example, the piezoelectric strain constant $d_{33,f}$ of the piezoelectric thin film P may be from 147 pC/N to 179 pC/N or from 149 pC/N to 174 pC/N.

For example, the relative permittivity εr (or $\varepsilon_{33}$) of the piezoelectric thin film P may be from 85 to 150 or from 88 to 127.

Figure 5:
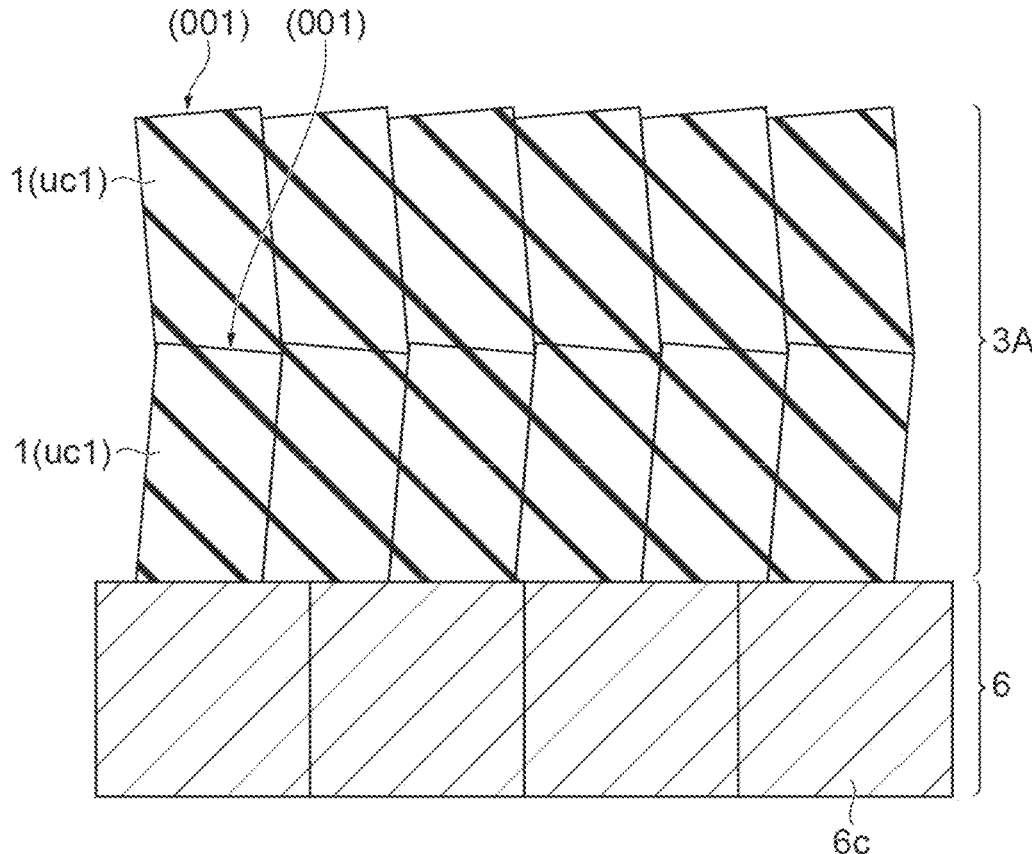
FIG. 5 is a schematic cross-sectional view of a piezoelectric thin film (a lower layer and a first piezoelectric layer) according to an embodiment of the present invention.
Figure 6:
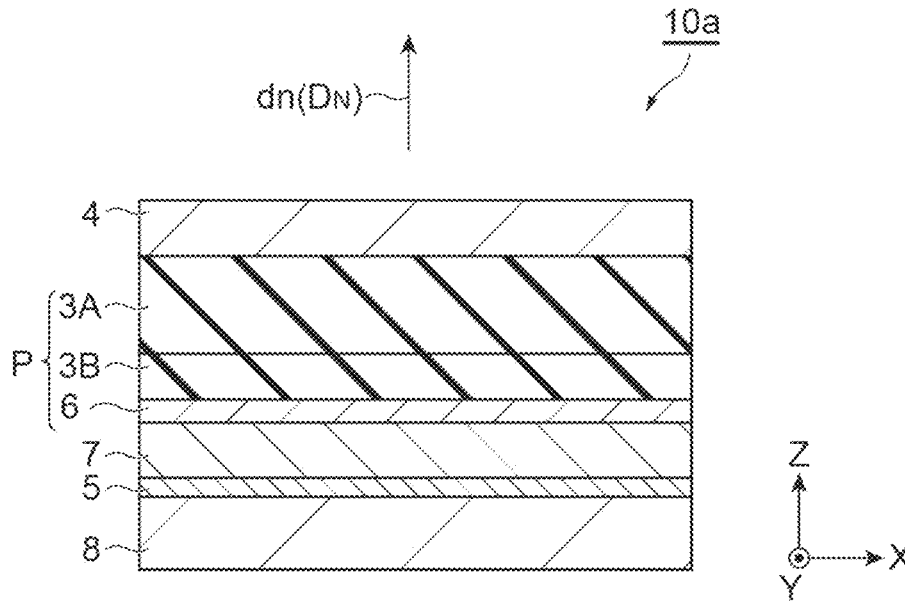
FIG. 6 is a schematic cross-sectional view of a piezoelectric thin film element according to another embodiment of the present invention.
Figure 8:
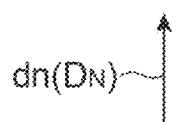
FIG. 8 is a schematic cross-sectional view of a piezoelectric thin film (a lower layer, a second piezoelectric layer, and a first piezoelectric layer) according to another embodiment of the present invention.

The inventor speculates that the piezoelectric thin film P can have a large piezoelectric performance index $(d_{33,f}/\varepsilon_r\varepsilon_0)$ by the following mechanism.

c1/a1 of the tetragonal crystal 1 constituting the first piezoelectric layer 3A is likely to increase due to lattice mismatch in which the lattice mismatch rate Δa is from 3.0% to 12.1%. With an increase in c1/a1 of the tetragonal crystal 1, the piezoelectric thin film P is likely to have a low relative permittivity $\varepsilon_r$. Furthermore, the (001) plane of the tetragonal crystal 1 is inclined to a degree at which the FWHM of the rocking curve RC is from 1.9° to 5.5°, due to lattice mismatch in which the lattice mismatch rate Δa is from 3.0% to 12.1%. That is, the FWHM of the rocking curve RC represents the degree of inclination of the (001) plane of the tetragonal crystal 1 due to lattice mismatch, and at least a part of the (001) plane of the tetragonal crystal 1 constituting the first piezoelectric layer 3A is not completely parallel to the surface of the first piezoelectric layer 3A. For example, FIG. 5 illustrates the inclination of the (001) plane of the tetragonal crystal 1 constituting the first piezoelectric layer 3A directly stacked on the lower layer 6. FIG. 8 illustrates the inclination of the (001) plane of the tetragonal crystal 1 constituting the first piezoelectric layer 3A directly stacked on the second piezoelectric layer 3B. That is, even in a case where the second piezoelectric layer 3B is interposed between the lower layer 6 and the first piezoelectric layer 3A, the (001) plane of the tetragonal crystal 1 constituting the first piezoelectric layer 3A is inclined. When the (001) plane of the tetragonal crystal 1 is inclined to a degree at which the FWHM of the rocking curve RC is from 1.9° to 5.5° the polarization axis of the tetragonal crystal 1 at the time of electric field application rotates, and thus the piezoelectric thin film P is easy to have a large piezoelectric strain constant $d_{33,f}$. From the above reason, both of a low relative permittivity $\varepsilon_r$ and a large piezoelectric strain constant $d_{33,f}$ are compatible, and thus the piezoelectric thin film P can have a larger piezoelectric performance index $(d_{33}/\varepsilon_r\varepsilon_0)$. In a case where the FWHM of the rocking curve RC is less than 1.9°, the (001) plane of the tetragonal crystal 1 is not sufficiently inclined, and thus the piezoelectric thin film P is difficult to have a large piezoelectric strain constant $d_{33,f}$. In a case where the FWHM of the rocking curve RC is more than 5.5°, the crystalline orientation of the first piezoelectric layer 3A is excessively impaired, and thus the piezoelectric thin film P is difficult to have a large piezoelectric strain constant $d_{33,f}$.

The above mechanism is a hypothesis, and the technical scope of the present invention is not limited by the above mechanism.

The spacing and the orientation direction of each crystal plane of each of the tetragonal crystal 1, the tetragonal crystal 2, and the lower crystal 6c may be specified based on an X-ray diffraction (XRD) pattern of the piezoelectric thin film P as measured by a 2θ-θ method in an out-of-plane direction and an in-plane direction of the surface of the first piezoelectric layer 3A. The crystal plane may be restated as a lattice plane.

Figure 4:
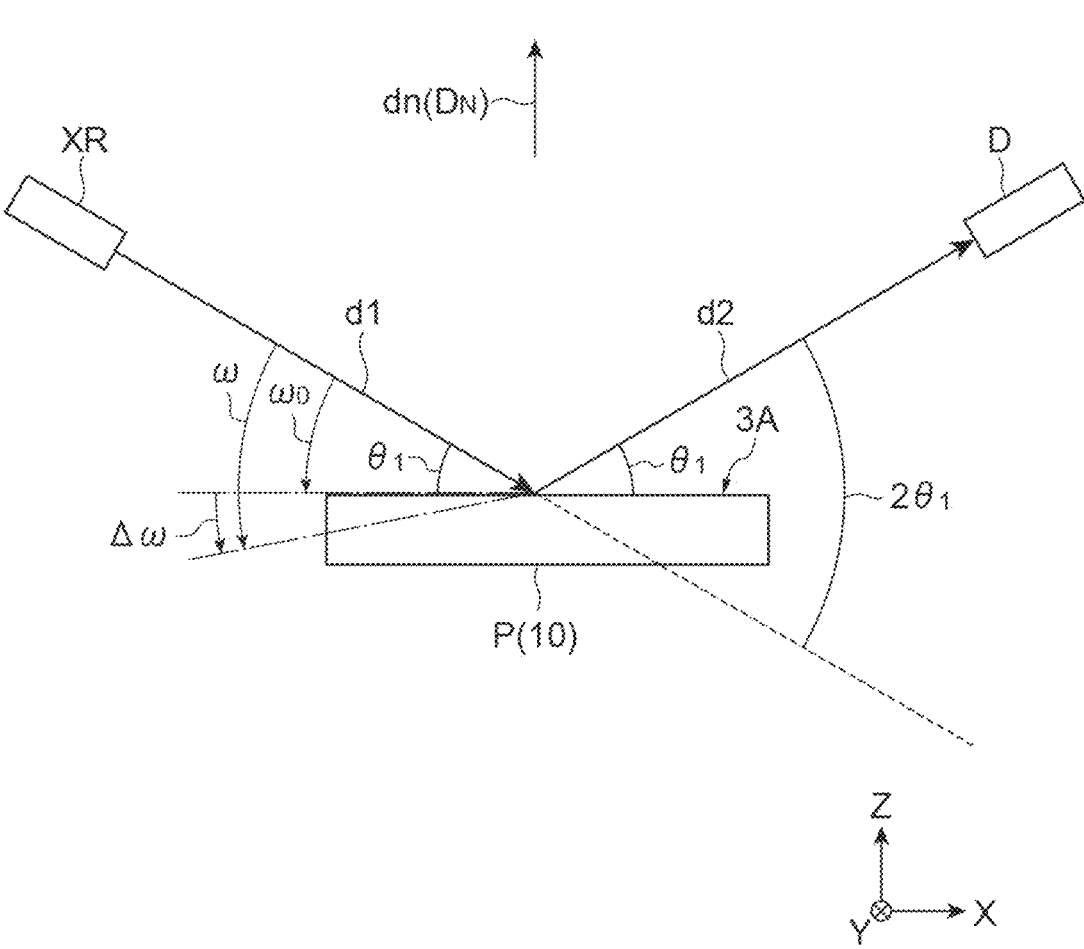
FIG. 4 is a schematic view illustrating a measurement method (ω scanning) of a rocking curve of diffracted X-rays derived from a (001) plane of the tetragonal crystal 1 contained in the first piezoelectric layer.

The rocking curve RC of diffracted X-rays of the (001) plane of the tetragonal crystal 1 is measured by ω scanning in the out-of-plane direction of the surface of the first piezoelectric layer 3A. The overview of the ω scanning is illustrated in FIG. 4. The ω scanning is one kind of out-of-plane measurement. In the w scanning, the surface of the first piezoelectric layer 3A is irradiated with an incident X-ray from an X-ray source XR. A direction d1 is the direction of the incident X-ray. The incident X-ray is diffracted by the (001) plane of the tetragonal crystal 1 contained in the first piezoelectric layer 3A and is detected as a diffracted X-ray by a detector D. In a case where a reference point is defined as a position at which the surface of the first piezoelectric layer 3A is irradiated with the incident X-ray, a direction d2 is a direction from the reference point toward the detector D. That is, the direction d2 is the direction of the detector D with respect to the position which is irradiated with the incident X-ray. $2\theta_1$ is a diffraction angle at which an intensity of the diffracted X-ray derived from the (001) plane of the tetragonal crystal 1 is a maximum value. $2\theta_1$ may be specified by a 2θ-θ method in the out-of-plane direction. W is an angle between the surface of the first piezoelectric layer 3A and the direction d1 of the incident X-ray. That is, ω is a tilt angle of the surface of the first piezoelectric layer 3A with respect to the direction d1 of the incident X-ray. The unit of ω is degree (°). The ω scanning is a method of fixing the angle between the direction d1 and the direction d2 to the diffraction angle $2\theta_1$ and continuously measuring the intensity of the diffracted X-ray derived from the (001) plane of the tetragonal crystal 1 with a change in ω. The rocking curve RC may be restated as the tilt distribution of the intensity of the diffracted X-rays derived from the (001) plane of the tetragonal crystal 1.

Figure 10:
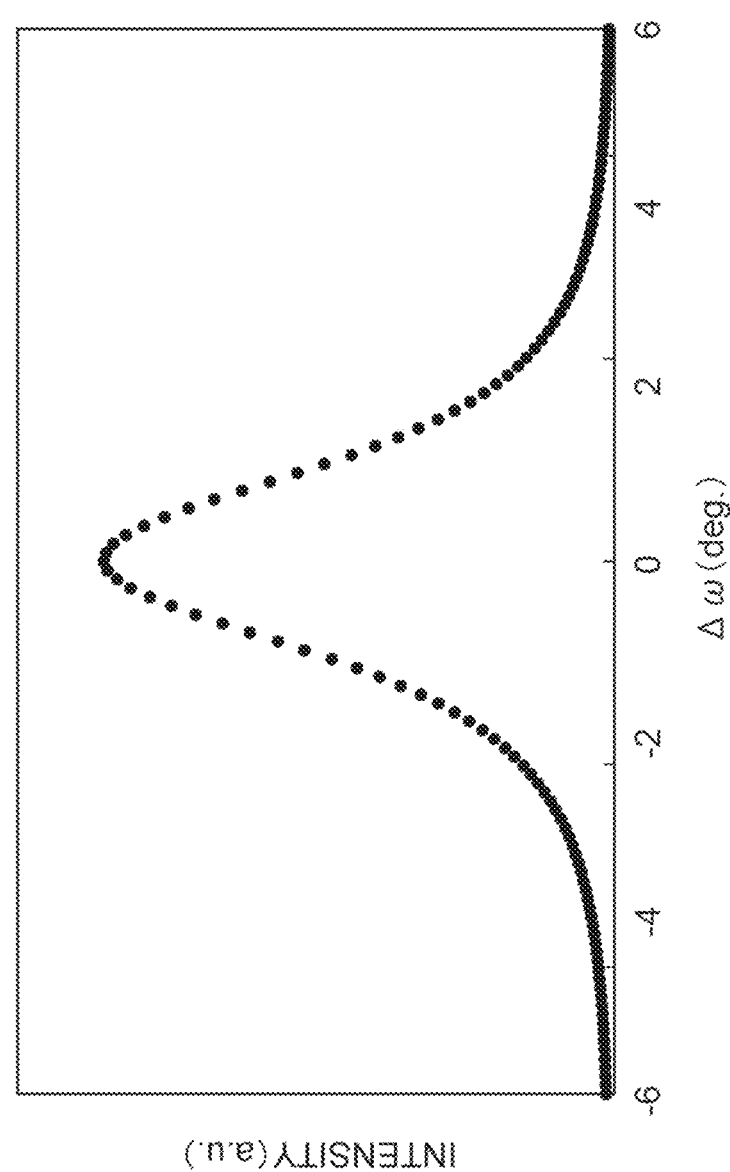
FIG. 10 shows an example of the rocking curve of diffracted X-rays derived from the (001) plane of the tetragonal crystal 1 contained in the first piezoelectric layer.

FIG. 10 shows an example of a rocking curve RC of the diffracted X-rays of the (001) plane of the tetragonal crystal 1. The horizontal axis of the rocking curve RC represents Aw. The vertical axis of the rocking curve RC represents the intensity of the diffracted X-ray. For example, the unit of the intensity of the diffracted X-ray may be an arbitrary unit. The origin in the horizontal axis of the rocking curve RC corresponds to ω (that is, $\theta_1$) at which the intensity of the diffracted X-ray derived from the (001) plane of the tetragonal crystal 1 is maximum. In a case where $\omega_0$ is defined as ω at which the intensity derived of the diffracted X-ray from the (001) plane of the tetragonal crystal 1 is a maximum value, the rocking curve RC is a distribution of intensities of the diffracted X-rays in a range where ω is from ($\omega_0-\Delta\omega$) to ($\omega_0+\Delta\omega$). The incident X-ray may be a character X-ray (for example, CuKα ray).

Figure 11:
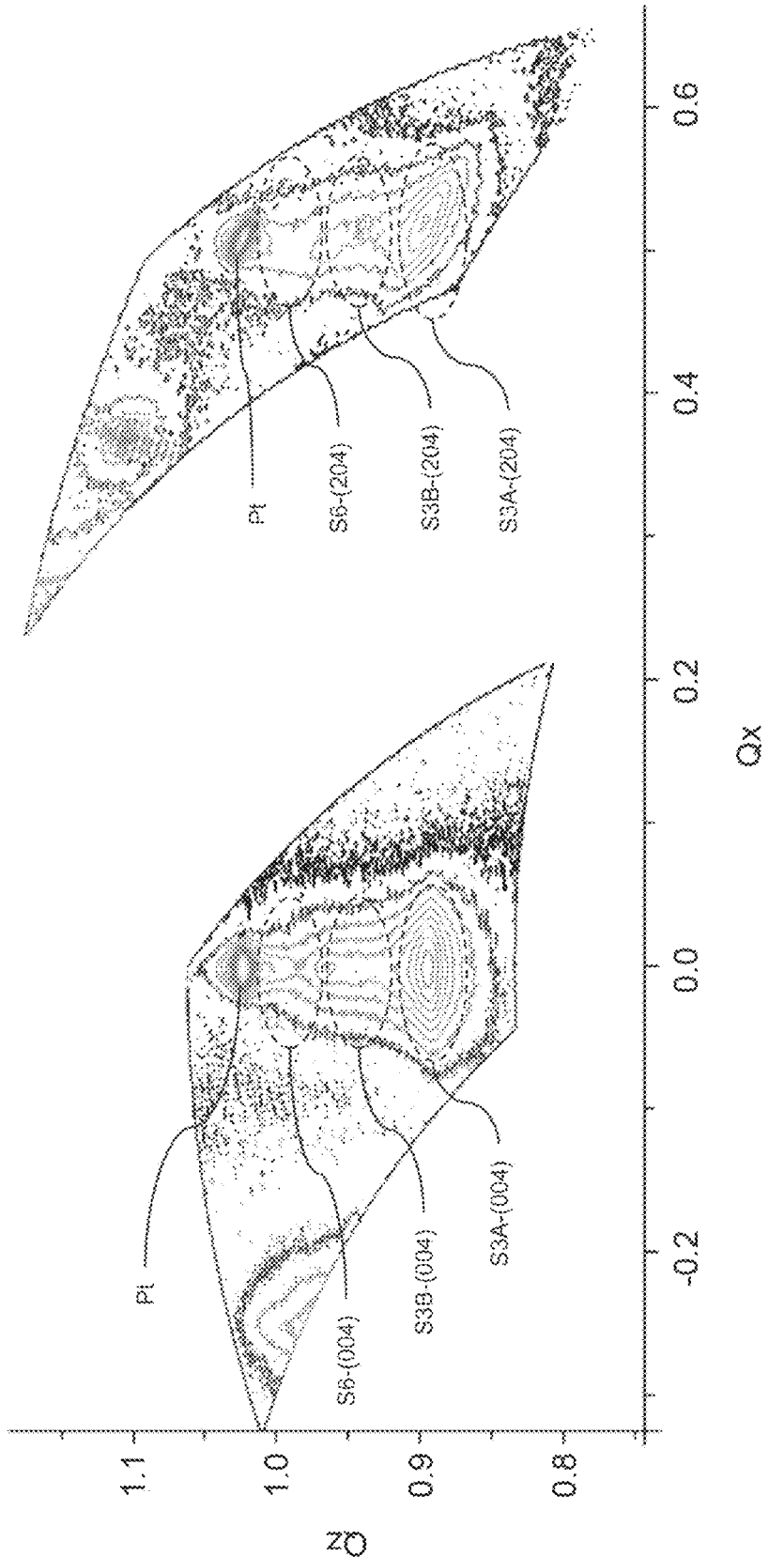
FIG. 11 shows an example of a reciprocal space map of diffracted X-rays derived from the piezoelectric thin film consisting of the lower layer, the second piezoelectric layer, and the first piezoelectric layer.

The spacing and the orientation direction of each crystal plane of each of the tetragonal crystal 1, the tetragonal crystal 2, and the lower crystal 6c may be specified by reciprocal space mapping. That is, the tetragonal crystal 1, the tetragonal crystal 2, and the lower crystal 6c may be detected using a reciprocal space map of the X-ray diffraction pattern and may be discriminated from one another. The reciprocal space map may be restated as an intensity distribution map of diffracted X-rays in the reciprocal space. For example, the reciprocal space map may be obtained by measuring intensities of the diffracted X-rays of the piezoelectric thin film P along two or more scan axes selected from the group consisting of an ω axis, a φ axis, a χ axis, a 2θ axis, and a 2θχ axis. For example, the reciprocal space map may be a two-dimensional map in a coordination system composed of a horizontal axis and a vertical axis orthogonal to each other. The horizontal axis of the two-dimensional reciprocal space map may represent a value corresponding to the reciprocal of the lattice constant in the in-plane direction of the surface of the first piezoelectric layer 3A. For example, the horizontal axis of the reciprocal space map may represent a value corresponding to the reciprocal (that is, 1/a) of a spacing "a" of the (100) planes. The vertical axis of the two-dimensional reciprocal space map may represent a value corresponding to the reciprocal of the lattice constant in the normal direction dn of the surface of the first piezoelectric layer 3A. For example, the vertical axis of the reciprocal space map may represent a value corresponding to the reciprocal (that is, 1/c) of a spacing "c" of the (001) planes. The reciprocal space map contains a plurality of spots. One spot corresponds to the diffracted X-ray derived from one crystal plane of a crystal of any one of the tetragonal crystal 1, the tetragonal crystal 2, and the lower crystal 6c. The spacing and orientation direction of one crystal plane of a crystal of any one of the tetragonal crystal 1, the tetragonal crystal 2, and the lower crystal 6c may be specified from the coordinate of one spot in the reciprocal space map. FIG. 11 shows an example of a reciprocal space map of the piezoelectric thin film P consisting of the lower layer 6, the second piezoelectric layer 3B, and the first piezoelectric layer 3A. S3A-(204) in FIG. 11 is a spot corresponding to a (204) plane of the tetragonal crystal 1 contained in the first piezoelectric layer 3A. S3B-(204) is a spot corresponding to a (204) plane of the tetragonal crystal 2 contained in the second piezoelectric layer 3B. S6-(204) is a spot corresponding to a (204) plane of the lower crystal 6c contained in the lower layer 6. S3A-(004) is a spot corresponding to a (004) plane of the tetragonal crystal 1 contained in the first piezoelectric layer 3A. S3B-(004) is a spot corresponding to a (004) plane of the tetragonal crystal 2 contained in the second piezoelectric layer 3B. S6-(004) is a spot corresponding to a (004) plane of the lower crystal 6c contained in the lower layer 6.

The spacing aL of the (100) planes of the lower crystal 6c contained in the lower layer 6 may be from 3.92 Å to 4.29 Å or from 3.93 Å to 4.24 Å. The spacing a1 of the (100) planes of the tetragonal crystal 1 contained in the first piezoelectric layer 3A may be from 3.650 Å to 3.940 Å or from 3.73 Å to 3.92 Å. In a case where aL and a1 are within the above ranges, the lattice mismatch rate Δa is easily controlled within a range from 3.0% to 12.1%.

As illustrated in FIG. 1B and FIG. 3B, the (001) plane of the lower crystal 6c (unit cell ucL) contained in the lower layer 6 may be oriented in the normal direction dn of the surface of the first piezoelectric layer 3A. In a case where the (001) plane of the lower crystal 6c (unit cell ucL) is oriented in the normal direction dn of the surface of the first piezoelectric layer 3A, the lattice mismatch rate Δa is easily controlled within a range from 3.0% to 12.1%.

The lower crystal 6c contained in the lower layer 6 may contain at least one compound among strontium ruthenate (SrRuO_3), barium titanate (BaTiO_3), and titanium nitride (TiN). The lower crystal 6c contained in the lower layer 6 may consist of one compound among strontium ruthenate, barium titanate, and titanium nitride. In a case where the lower crystal 6c contained in the lower layer 6 contains at least one compound among strontium ruthenate, barium titanate, and titanium nitride, the lattice mismatch rate Δa is easily controlled within a range from 3.0% to 12.1%.

The crystalline structure of the lower crystal 6c consisting of strontium ruthenate is a perovskite-type structure. The spacing aL of (100) planes of the lower crystal 6c consisting of strontium ruthenate is about 3.93 Å. The spacing a1 of (100) planes of a conventional thin film (piezoelectric layer) consisting of lead zirconate titanate (PZT) is more than 4.00 Å. The spacing a1 of (100) planes of a conventional thin film (piezoelectric layer) consisting of bismuth ferrite (BiFeO_3) is about 3.96 Å. Therefore, in a case where the lower layer 6 consists of strontium ruthenate and the first piezoelectric layer consists of lead zirconate titanate or bismuth ferrite, the lattice mismatch rate Δa is a negative value. In a case where the lattice mismatch rate Δa is a negative value, the relative permittivity $\varepsilon_r$ of the piezoelectric thin film P is relatively low, but the FWHM of the rocking curve RC is small, so that the piezoelectric thin film P is difficult to have a large piezoelectric performance index.

The lower layer 6 containing strontium ruthenate has electrical conductivity. In a case where the lower layer 6 has electrical conductivity, the lower layer 6 may function as the first electrode layer 7, and the piezoelectric thin film element 10 does not have to contain the first electrode layer 7 other than the lower layer 6.

The crystalline structure of the lower crystal 6c consisting of barium titanate is a perovskite-type structure. The spacing aL of (100) planes of the lower crystal 6c consisting of barium titanate is about 3.99 Å. The crystalline structure of the lower crystal 6c consisting of titanium nitride is a sodium chloride-type structure (face-centered cubic lattice structure). The spacing aL of (100) planes of the lower crystal 6c consisting of titanium nitride is about 4.24 Å. The piezoelectric thin film P in which the lower layer 6 consists of a crystal of at least one compound among barium titanate and titanium nitride is likely to have a larger piezoelectric performance index than that of the piezoelectric thin film P in which the lower layer 6 consists of a crystal of strontium ruthenate.

c2/a2 of the tetragonal crystal 2 contained in the second piezoelectric layer 3B may be smaller than c1/a1 of the tetragonal crystal 1 contained in the first piezoelectric layer 3A. That is, the anisotropy of the tetragonal crystal 2 may be lower than the anisotropy of the tetragonal crystal 1.

In a case where c1/a1 is larger than c2/a2, the relative permittivity of the tetragonal crystal 1 is lower than the relative permittivity of the tetragonal crystal 2. However, since c1/a1 is larger than c2/a2, the crystalline structure of the tetragonal crystal 1 is stronger than the crystalline structure of the tetragonal crystal 2, and thus an atom in the tetragonal crystal 1 is more difficult to move than an atom in the tetragonal crystal 2. Therefore, the polarization reversal of the tetragonal crystal 1 is more difficult to occur than the polarization reversal of the tetragonal crystal 2, and the piezoelectric properties of the tetragonal crystal 1 itself are inferior to the piezoelectric properties of the tetragonal crystal 2 itself. In other words, in a case where c2/a2 is smaller than c1/a1, the relative permittivity of the tetragonal crystal 2 is higher than the relative permittivity of the tetragonal crystal 1, but the crystalline structure of the tetragonal crystal 2 is softer than the crystalline structure of the tetragonal crystal 1, and thus the atom in the tetragonal crystal 2 is easier to move than the atom in the tetragonal crystal 1. Therefore, the polarization reversal of the tetragonal crystal 2 is more likely to occur than the polarization reversal of the tetragonal crystal 1.

In a case where c2/a2 is smaller than c1/a1 and the electric field is applied to the piezoelectric thin film P, the polarization reversal of the tetragonal crystal 2 in the second piezoelectric layer 3B is likely to occur prior to the polarization reversal of the tetragonal crystal 1 in the first piezoelectric layer 3A. Due to the polarization reversal of the tetragonal crystal 2 preceding the polarization reversal of the tetragonal crystal 1, the crystalline structure of the tetragonal crystal 1 at an interface between the first piezoelectric layer 3A and the second piezoelectric layer 3B becomes unstable. In other words, due to the polarization reversal of the tetragonal crystal 2, the polarization of the tetragonal crystal 1 is likely to fluctuate at an interface between the tetragonal crystal 1 and the tetragonal crystal 2. For example, due to the polarization reversal of the tetragonal crystal 2 in the second piezoelectric layer 3B, an electric charge in the surface of the second piezoelectric layer 3B is repulsed by an electric charge in the surface of the first piezoelectric layer 3A at the interface between the first piezoelectric layer 3A and the second piezoelectric layer 3B, and thus the polarization of the tetragonal crystal 1 fluctuates.

Due to the mechanism as described above, the polarization reversal of the tetragonal crystal 2 induces the polarization reversal of the tetragonal crystal 1. That is, when the second piezoelectric layer 3B is disposed as a buffer layer promoting the polarization reversal of the first piezoelectric layer 3A between the lower layer 6 and the first piezoelectric layer 3A, the polarization reversal is likely to occur in the entire piezoelectric thin film P. As a result, the piezoelectric properties of the entire piezoelectric thin film P are more excellent than those of the tetragonal crystal 1 itself, both of large $d_{33,f}$ and low $\varepsilon_r$ are easily achieved, and thus the piezoelectric thin film P is likely to have a large piezoelectric performance index.

The above mechanism regarding c1/a1 and c2/a2 is a hypothesis, and the technical scope of the present invention is not limited by the above mechanism.

In contrast with the piezoelectric thin film P, the strain of the crystalline structure attributable to the stress is difficult to occur in the bulk of the piezoelectric material. Therefore, most of perovskite-type oxides constituting the bulk of the piezoelectric material are cubic crystals, and there is a tendency that the bulk of the piezoelectric material is more difficult to have piezoelectric properties attributable to the tetragonal crystal of the perovskite-type oxide than the piezoelectric thin film P.

c1/a1 of the tetragonal crystal 1 may be from 1.050 to 1.250 or from 1.063 to 1.249. In a case where c1/a1 is 1.050 or more, the relative permittivity of each of the first piezoelectric layer 3A containing the tetragonal crystal 1 and the piezoelectric thin film P is likely to decrease, and thus the piezoelectric performance index of the piezoelectric thin film P is likely to increase. In a case where c1/a1 is 1.250 or less, the polarization reversal of the tetragonal crystal 1 is likely to occur, and thus the piezoelectric performance index of the piezoelectric thin film P is likely to increase. For example, c1 may be from 3.980 Å to 4.750 Å.

c2/a2 may be from 1.010 to 1.110 or from 1.014 to 1.108. In a case where c2/a2 is within the above range, the polarization reversal of the tetragonal crystal 2 is more likely to occur than the polarization reversal of the tetragonal crystal 1, the polarization reversal of the tetragonal crystal 2 is likely to induce the polarization reversal of the tetragonal crystal 1, and thus the piezoelectric thin film P is likely to have a large piezoelectric performance index. In a case where c2/a2 is out of the above range, the relative permittivity of the tetragonal crystal 2 tends to be excessively high, or the piezoelectric properties of the tetragonal crystal 2 itself tend to deteriorate. For example, c2 may be from 3.920 Å to 4.390 Å. For example, a2 may be from 3.890 Å to 3.950 Å.

A magnitude relationship among cL, c1, and c2 and a magnitude relationship among aL, a1, and a2 may be specified by observing a cross-section of the piezoelectric thin film P parallel to the thickness direction of the piezoelectric thin film P using a scanning transmission electron microscope (STEM) with the resolution of an atomic level.

In order to specify a specific value of each of c1 and c2 with high accuracy, a peak P1 of diffracted X-rays derived from the (001) plane of the tetragonal crystal 1 and a peak P2 of diffracted X-rays derived from the (001) plane of the tetragonal crystal 2 may be measured by out-of-plane measurement ($2\theta$-$\theta$ method) in the surface of the piezoelectric thin film P. One measured X-ray diffraction pattern contains both of the peak P1 and the peak P2. In a case where a diffraction angle $2\theta_1$ of the peak P1 of the diffracted X-rays derived from the (001) plane of the tetragonal crystal 1 is close to a diffraction angle $2\theta_2$ of the peak P2 of the diffracted X-rays derived from the (001) plane of the tetragonal crystal 2, and a peak P3 at which the peak P1 and the peak P2 overlap each other is measured, the peak P1 may be approximated by a Gaussian function g1, the peak P2 may be approximated by another Gaussian function g2, and curve fitting of g1+g2 and the peak P3 may be performed. g1 obtained after the curve fitting may be regarded as P1, and g2 obtained after the curve fitting may be regarded as P2.

In order to specify a specific value of each of a1 and a2 with high accuracy, a peak P1' of diffracted X-rays derived from the (100) plane of the tetragonal crystal 1 and a peak P2' of diffracted X-rays derived from the (100) plane of the tetragonal crystal 2 may be measured by in-plane measurement ($2\theta$-$\theta$ method) in the surface of the piezoelectric thin film P. One measured X-ray diffraction pattern contains both of the peak P1' and the peak P2'. In a case where a diffraction angle $2\theta_1'$ of the peak P1' of the diffracted X-rays derived from the (100) plane of the tetragonal crystal 1 is close to a diffraction angle $2\theta_2'$ of the peak P2' of the diffracted X-rays derived from the (100) plane of the tetragonal crystal 2, and a peak P3' at which the peak P1' and the peak P2' overlap each other is measured, the peak P1' may be approximated by a Gaussian function G1, the peak P2' may be approximated by another Gaussian function G2, and curve fitting of G1+G2 and the peak P3' may be performed. G1 obtained after the curve fitting may be regarded as P1', and G2 obtained after the curve fitting may be regarded as P2'.

A peak intensity (maximum intensity) of diffracted X-rays of the (001) plane of the tetragonal crystal 1 is $I_1$. A peak intensity (maximum intensity) of diffracted X-rays of the (001) plane of the tetragonal crystal 2 is $I_2$. $I_1/(I_1+I_2)$ may be 0.90 or more and less than 1.00 or from 0.91 to 0.99. In a case where $I_1/(I_1+I_2)$ is within the above ranges, both of a large piezoelectric strain constant ($d_{33,f}$) and a low relative permittivity ($\varepsilon_r$) are easily achieved, and thus the piezoelectric thin film P is likely to have a large piezoelectric performance index. A unit of each of $I_1$ and $I_2$ may be, for example, cps (counts per second). $I_1$ and $I_2$ may be measured by out-of-plane measurement in the surface of the first piezoelectric layer 3A. Measurement conditions of each of $I_1$ and $I_2$ may be set such that each of $I_1$ and $I_2$ is higher than the background intensity by at least triple digits or more.

$I_1$ may be proportional to the total area of the (001) planes of the tetragonal crystal 1 oriented in the normal direction dn of the surface of the first piezoelectric layer 3A, and $I_2$ may be proportional to the total area of the (001) planes of the tetragonal crystal 2 oriented in the normal direction dn of the surface of the first piezoelectric layer 3A. In other words, $I_1$ may be proportional to the amount of the tetragonal crystal 1 contained in the piezoelectric thin film P, and $I_2$ may be proportional to the amount of the tetragonal crystal 2 contained in the piezoelectric thin film P. Therefore, $I_1/(I_1+I_2)$ may be an abundance ratio of the tetragonal crystal 1 with respect to the total amount of the tetragonal crystal 1 and the tetragonal crystal 2. That is, the abundance ratio of the tetragonal crystal 1 with respect to the total amount of the tetragonal crystal 1 and the tetragonal crystal 2 may be 90% or more and less than 100%.

The degree of orientation of each of the (001) plane of the tetragonal crystal 1 and the (001) plane of the tetragonal crystal 2 may be quantified by the orientation degree. As the orientation degree of each of the (001) plane of the tetragonal crystal 1 and the (001) plane of the tetragonal crystal 2 is larger, the piezoelectric thin film P is likely to have a large piezoelectric performance index. The orientation degree of each crystal plane may be calculated based on a peak of diffracted X-rays derived from each crystal plane. The peak of the diffracted X-rays derived from each crystal plane may be measured by out-of-plane measurement in the surface of the first piezoelectric layer 3A.

The orientation degree of the (001) plane of the tetragonal crystal 1 in the normal direction dn of the surface of the first piezoelectric layer 3A may be represented as $100 \times I_1/\Sigma I_{1(hkl)}$. $\Sigma I_{1(hkl)}$ is the sum of peak intensities of diffracted X-rays derived from respective crystal planes of the tetragonal crystal 1 as measured in the out-of-plane direction of the surface of the first piezoelectric layer 3A. $\Sigma I_{1(hkl)}$ may be, for example, $I_{1(001)}+I_{1(110)}+I_{1(111)}$. $I_{1(001)}$ is $I_1$ described above. That is, $I_{1(001)}$ is a peak intensity (maximum intensity) of diffracted X-rays of the (001) plane of the tetragonal crystal 1 as measured in the out-of-plane direction of the surface of the first piezoelectric layer 3A. $I_{1(110)}$ is a peak intensity (maximum intensity) of diffracted X-rays of a (110) plane of the tetragonal crystal 1 as measured in the out-of-plane direction of the surface of the first piezoelectric layer 3A. $I_{1(111)}$, is a peak intensity (maximum intensity) of diffracted X-rays of a (111) plane of the tetragonal crystal 1 as measured in the out-of-plane direction of the surface of the first piezoelectric layer 3A.

The orientation degree of the (001) plane of the tetragonal crystal 2 may be represented as $100 \times I_2/\Sigma I_{2(hkl)}$. $\Sigma I_{2(hkl)}$ is the sum of peak intensities of diffracted X-rays derived from respective crystal planes of the tetragonal crystal 2 as measured in the out-of-plane direction of the surface of the first piezoelectric layer 3A. $\Sigma I_{2(hkl)}$ may be, for example, $I_{2(001)}+I_{2(110)}+I_{2(111)}$. $I_{2(001)}$ is $I_2$ described above. That is, $I_{2(001)}$ is a peak intensity (maximum intensity) of diffracted X-rays of the (001) plane of the tetragonal crystal 2 as measured in the out-of-plane direction of the surface of the first piezoelectric layer 3A. $I_{2(110)}$ is a peak intensity (maximum intensity) of diffracted X-rays of a (110) plane of the tetragonal crystal 2 as measured in the out-of-plane direction of the surface of the first piezoelectric layer 3A. $I_{2(111)}$ is a peak intensity (maximum intensity) of diffracted X-rays of a (111) plane of the tetragonal crystal 2 as measured in the out-of-plane direction of the surface of the first piezoelectric layer 3A.

The degree of orientation of each of the (001) plane of the tetragonal crystal 1 and the (001) plane of the tetragonal crystal 2 may be quantified by an orientation degree F. based on a Lotgering method. Even in the case of calculating the orientation degree by any of the above-described methods, the orientation degree of each of the (001) plane of the tetragonal crystal 1 and the (001) plane of the tetragonal crystal 2 may be from 70% to 100%, preferably from 80% to 100%, and more preferably from 90% to 100%. In other words, the (001) plane of the tetragonal crystal 1 may be oriented in the normal direction dn of the surface of the first piezoelectric layer 3A prior to the other crystal planes of the tetragonal crystal 1, and the (001) plane of the tetragonal crystal 2 may also be oriented in the normal direction dn of the surface of the first piezoelectric layer 3A prior to the other crystal planes of the tetragonal crystal 2.

One or both of the tetragonal crystal 1 and the tetragonal crystal 2 may contain $Fe^{2+}$. In a case where one or both of the tetragonal crystal 1 and the tetragonal crystal 2 contain $Fe^{2+}$, the piezoelectric thin film P is likely to have a large piezoelectric performance index.

In a case where a $BiFeO_3$—$(Bi,K)TiO_3$-based piezoelectric thin film has a composition near a morphotropic phase boundary between a tetragonal crystal and a rhombohedral crystal, the piezoelectric properties ($d_{33,f}$) derived from the tetragonal crystal are improved, but the permittivity ($\varepsilon_0\varepsilon_r$) is also increased, so that the piezoelectric performance index is difficult to be improved. In order to suppress an increase in permittivity, it is desirable that the piezoelectric thin film is composed of the tetragonal crystal to improve the piezoelectric properties (ferroelectricity) of the piezoelectric thin film. The tetragonality of the piezoelectric thin film is achieved by epitaxial stress (compressive stress due to lattice mismatch). This is because, due to the epitaxial stress parallel to the surface of the piezoelectric thin film, the piezoelectric thin film is compressed in directions (that is, a-axis direction and b-axis direction) parallel to the surface of the piezoelectric thin film and the piezoelectric thin film strains. However, as the thickness of the piezoelectric thin film increases, it is difficult to improve the tetragonality of the piezoelectric thin film only by the epitaxial stress. This is because, as the thickness of the piezoelectric thin film increases, it is difficult to strain the entire piezoelectric thin film by the epitaxial stress. Furthermore, since the lattice mismatch rate $\Delta a$ is a positive value (from 3.0% to 12.1%), not compressive stress but tensile stress is likely to act on the first piezoelectric layer 3A and the second piezoelectric layer 3B. Therefore, even in a case where the piezoelectric thin film is thick to the extent that the epitaxial stress generated in the piezoelectric thin film is weakened and the compressive stress is difficult to act on the piezoelectric thin film, it is desirable to stabilize the tetragonal crystal structure of the piezoelectric thin film. In this regard, in one or both of the tetragonal crystal 1 and the tetragonal crystal 2, the ion located in the B site may be substituted with $Fe^{2+}$ such that the electron configuration of the element (ion) located in the B site of the perovskite-type oxide becomes similar to the d6 electron configuration of $Co^{3+}$ constituting $BiCoO_3$. As a result, even in a case where the piezoelectric thin film P is thick to the extent that the epitaxial stress generated in the piezoelectric thin film P, the tetragonality of the piezoelectric thin film P is improved. In other words, even in a case where the piezoelectric thin film P is thick to the extent that the epitaxial stress generated in the piezoelectric thin film P is weakened, the first piezoelectric layer 3A is likely to contain the tetragonal crystal 1, and the second piezoelectric layer 3B is likely to contain the tetragonal crystal 2.

Also in the case of the composition system near MPB in which a rhombohedral crystal is expected to be formed in the bulk of the piezoelectric material, a $BO_6$ octahedron (or a $BO_5$ pyramid) in the tetragonal crystal in which a part of the B site is substituted with $Fe^{2+}$ may rotate (rotate about the c axis), but the polarization rotation attributable to the formation of a pseudo-cubic crystal is suppressed. In other words, in the perovskite oxide in which a part of the B site is substituted with $Fe^{2+}$, MPB is difficult to exist, and the polarization rotation in which the direction of the c-axis of the tetragonal crystal changes is difficult to occur.

By the above mechanism, in a case where one or both of the tetragonal crystal 1 and the tetragonal crystal 2 contain $Fe^{2+}$, both of a large piezoelectric strain constant ($d_{33,f}$) and a low relative permittivity ($\varepsilon_r$) are easily achieved, and thus the piezoelectric performance index is likely to increase. The above mechanism regarding $Fe^{2+}$ is a hypothesis, and the technical scope of the present invention is not limited by the above mechanism regarding $Fe^{2+}$.

In contrast with the piezoelectric thin film P, the strain of the crystalline structure attributable to the stress is difficult to occur in the bulk of the piezoelectric material. Therefore, most of perovskite-type oxides constituting the bulk of the piezoelectric material are cubic crystals, and there is a tendency that the bulk of the piezoelectric material is more difficult to have piezoelectric properties attributable to the tetragonal crystal of the perovskite-type oxide than the piezoelectric thin film P.

A thickness of each of the crystalline substrate 8, the intermediate layer 5, the first electrode layer 7, the lower layer 6, the second piezoelectric layer 3B, the first piezoelectric layer 3A, and the second electrode layer 4 may be uniform.

A thickness TL of the lower layer 6 in the normal direction dn of the surface of the first piezoelectric layer 3A may be from 10 nm to 350 nm. In a case where the thickness TL of the lower layer 6 is within the above range, the lattice mismatch rate Δa is easily controlled within a range from 3.0% to 12.1%, and the FWHM of the rocking curve RC is easily controlled within a range from 1.9° to 5.5°.

A thickness T1 of the first piezoelectric layer 3A in the normal direction dn of the surface of the first piezoelectric layer 3A may be larger than a thickness T2 of the second piezoelectric layer 3B in the normal direction dn of the surface of the first piezoelectric layer 3A. A thickness Tp of the piezoelectric thin film P may be equal to the sum of the thickness TL of the lower layer 6, the thickness T1 of the first piezoelectric layer 3A, and the thickness T2 of the second piezoelectric layer 3B. The thickness Tp of the piezoelectric thin film P may be from 510 nm to 5350 nm or from 590 nm to 5100 nm. The thickness T1 of the first piezoelectric layer 3A may be from 490 nm to 4700 nm or from 500 nm to 4920 nm. The thickness T2 of the second piezoelectric layer 3B may be from 10 nm to 300 nm or from 10 nm to 290 nm. In a case where the thickness T2 of the second piezoelectric layer 3B is 10 nm or more, the polarization reversal of the tetragonal crystal 2 in the second piezoelectric layer 3B is likely to induce the polarization reversal of the tetragonal crystal 1 in the first piezoelectric layer 3A. As a result, the piezoelectric thin film P is likely to have a large piezoelectric performance index. In a case where the thickness T2 of the second piezoelectric layer 3B is 300 nm or less, the relative permittivity of the piezoelectric thin film P is likely to decrease, and thus the piezoelectric performance index of the piezoelectric thin film P is likely to increase. Even in a case where the thickness Tp of the piezoelectric thin film P is 510 nm or more and the piezoelectric thin film P is thick, the piezoelectric thin film P is likely to have a large piezoelectric performance index by substituting an ion located in the B site of the perovskite-type oxide with $Fe^{2+}$. By adjusting the thickness Tp of the piezoelectric thin film P to 5350 nm or less, the tetragonal crystal 1 and the tetragonal crystal 2 are easily formed regardless of epitaxial stress, and thus the piezoelectric thin film P is likely to have a large piezoelectric performance index.

TL, T1, T2, and Tp are not limited to the above ranges. Measurement methods of TL, T1, T2, and Tp are not limited. For example, the thickness Tp of the piezoelectric thin film P may be measured with a scanning electron microscope (SEM) in the cross-section of the piezoelectric thin film P parallel to the normal direction dn of the surface of the first piezoelectric layer 3A. The lower layer 6, the first piezoelectric layer 3A, and the second piezoelectric layer 3B may be discriminated from one another in the cross-section of the piezoelectric thin film P based on a difference in composition or magnitude relationships of cL/aL, c1/a1, and c2/a2. TL, T1, and T2 may be measured by the SEM in the cross-section of the piezoelectric thin film P.

The tetragonal crystal 1 may be represented by Chemical Formula 1 below. Chemical Formula 1 below is substantially the same as Chemical Formula 1a below.

$$x1(Bi_{1-\alpha}E^A{}_\alpha)E^BO_3-y1BiFeO_3-z1Bi(Fe_{0.5}Ti_{0.5})O_3 \qquad (1)$$

$$(Bi_{x1(1-\alpha)+y1+z1}E^A{}_{x1\alpha})(E^B{}_{x1}Fe_{y1+0.5z1}Ti_{0.5z1})O_{3\pm\delta} \qquad (1a)$$

x1+y1+z1 in Chemical Formula 1 above may be 1.00. $E^A$ in Chemical Formula 1 above is the element described above. $E^B$ in Chemical Formula 1 above is the element described above.

Bi constituting $(Bi_{1-\alpha}E^A{}_\alpha)E^BO_3$ in Chemical Formula 1 above is trivalent Bi ($Bi^{3+}$) or pentavalent Bi ($Bi^{5+}$). The sum of valences (ion valences) of $E^A$ constituting $(Bi_{1-\alpha}E^A{}_\alpha)E^BO_3$ in Chemical Formula 1 above is represented as $V_A$. The sum of valences (ion valences) of $E^B$ constituting $(Bi_{1-\alpha}E^A{}_\alpha)E^BO_3$ is represented as $V_B$. The sum of valences of Bi, $E^A$, and $E^B$ constituting $(Bi_{1-\alpha}E^A{}_\alpha)E^BO_3$ in Chemical Formula 1 is represented as $3(1-\alpha)+V_A\alpha+V_B$ or $5(1-\alpha)+V_A\alpha+V_B$. $3(1-\alpha)+V_A\alpha+V_B$ or $5(1-\alpha)+V_A\alpha+V_B$ may be +6 that is balanced with the sum (−6) of valences (ion valences) of O. $3(1-\alpha)+V_A\alpha$ or $5(1-\alpha)+V_A\alpha$ may be +3. $V_B$ may be +3. In a case where two elements corresponding the element $E^B$ in Chemical Formula 1 above are represented as an element $E^{B1}$ and an element $E^{B2}$, Chemical Formula 1 above is substantially the same as Chemical Formula 1' below. $\beta$ in Chemical Formula 1' below may be from 0.00 to 1.00. The valence (ion valence) of $E^{B1}$ is represented as $V_{B1}$. The valence (ion valence) of $E^{B2}$ is represented as $V_{B2}$. The sum $V_B$ of valences (ion valences) of $E^B$ is represented as $(1-\beta)V_{B1}+\beta V_{B2}$. $(1-\beta)V_{B1}+\beta V_{B2}$ may be +3.

$$x1(Bi_{1-\alpha}E^A{}_\alpha)(E^{B1}{}_{1-\beta}E^{B2}{}_\beta)O_3-y1BiFeO_3-z1Bi(Fe_{0.5}Ti_{0.5})O_3 \quad (1')$$

$Bi_{x1(1-\alpha)+y1+z1}E^A{}_{x1\alpha}$ in Chemical Formula 1a above corresponds to elements located in the A site of the perovskite structure. $E^B{}_{x1}Fe_{y1+0.5z1}Ti_{0.5z1}$ in Chemical Formula 1a corresponds to elements located in the B site of the perovskite structure.

Fe constituting y1BiFeO$_3$ in Chemical Formula 1 above has a valence of 3, but Fe constituting z1Bi(Fe$_{0.5}$Ti$_{0.5}$)O$_3$ in Chemical Formula 1 above has a valence of 2. Therefore, the composition of a raw material for the first piezoelectric layer 3A is adjusted so that the molar ratio of each of Bi, $E^A$, $E^B$, Fe, and Ti in the entire raw material for the first piezoelectric layer 3A is consistent with the molar ratio of each of Bi, $E^A$, $E^B$, Fe, and Ti in Chemical Formula 1 above, and thus the tetragonal crystal 1 can contain Fe$^{2+}$.

x1 in Chemical Formula 1 above may be from 0.10 to 0.90, from 0.10 to 0.85, or from 0.15 to 0.85. In a case where x1 is from 0.10 to 0.90, the tetragonal crystal 1 is likely to have the above-described crystalline orientation, c1/a1 is likely to fall within the above range, the lattice mismatch rate $\Delta a$ is likely to fall within the above range, and the FWHM of the rocking curve RC is likely to fall within the above range.

y1 in Chemical Formula 1 above may be from 0.05 to 0.85 or from 0.05 to 0.80. In a case where y1 is from 0.05 to 0.85, the tetragonal crystal 1 is likely to have the above-described crystalline orientation, c1/a1 is likely to fall within the above range, the lattice mismatch rate $\Delta a$ is likely to fall within the above range, and the FWHM of the rocking curve RC is likely to fall within the above range.

z1 in Chemical Formula 1 above may be from 0.05 to 0.85 or from 0.05 to 0.80. In a case where z1 is from 0.05 to 0.85, the tetragonal crystal 1 is likely to have the above-described crystalline orientation, c1/a1 is likely to fall within the above range, the lattice mismatch rate $\Delta a$ is likely to fall within the above range, and the FWHM of the rocking curve RC is likely to fall within the above range.

$\alpha$ in Chemical Formula 1 above may be 0.00 or more and less than 1.00. From the viewpoints that the tetragonal crystal 1 is likely to have the above-described crystalline orientation, c1/a1 is likely to fall within the above range, the lattice mismatch rate $\Delta a$ is likely to fall within the above range, and the FWHM of the rocking curve RC is likely to fall within the above range, a may be 0.50. As described above, $\beta$ in Chemical Formula 1' above may be from 0.00 to 1.00 or more than 0.00 and less than 1.00. From the viewpoints that the tetragonal crystal 1 is likely to have the above-described crystalline orientation, c1/a1 is likely to fall within the above range, the lattice mismatch rate $\Delta a$ is likely to fall within the above range, and the FWHM of the rocking curve RC is likely to fall within the above range, $\beta$ may be 0.50.

$\delta$ in Chemical Formula 1a above may be 0 or more. $\delta$ may be a value other than 0 as long as the crystalline structure (perovskite structure) of the tetragonal crystal 1 is maintained. For example, $\delta$ may be more than 0 and 1.0 or less. $\delta$ may be calculated, for example, from the valence of each ion located in each of the A site and the B site in the tetragonal crystal 1. The valence of each ion may be measured by an X-ray photoelectron spectroscopy (XPS) method.

The total value of mole numbers of Bi and $E^A$ contained in the tetragonal crystal 1 may be represented as $[A]_1$, the total value of mole numbers of Fe, Ti, and $E^B$ contained in the tetragonal crystal 1 may be represented as $[B]_1$, and $[A]_1/[B]_1$ may be 1.0. $[A]_1/[B]_1$ may be a value other than 1.0 as long as the crystalline structure (perovskite structure) of the tetragonal crystal 1 is maintained. That is, $[A]_1/[B]_1$ may be less than 1.0, or $[A]_1/[B]_1$ may be larger than 1.0.

The tetragonal crystal 2 may be represented by Chemical Formula 2 below. Chemical Formula 2 below is substantially the same as Chemical Formula 2a below.

$$x2(Bi_{1-\alpha}E^A{}_\alpha)E^BO_3-y2BiFeO_3-z2Bi(Fe_{0.5}Ti_{0.5})O_3 \quad (2)$$

$$(Bi_{x2(1-\alpha)+y2+z2}E^A{}_{x2\alpha})(E^B{}_{x2}Fe_{y2+0.5z2}Ti_{0.5z2})O_{3\pm\delta} \quad (2a)$$

x2+y2+z2 in Chemical Formula 2 above may be 1.00. $E^A$ in Chemical Formula 2 above is the element described above. $E^B$ in Chemical Formula 2 above is the element described above. $E^A$ in Chemical Formula 2 above may be the same as or different from $E^A$ in Chemical Formula 1 above. $E^B$ in Chemical Formula 2 above may be the same as or different from $E^B$ in Chemical Formula 1 above. The valence of each element in Chemical Formula 2 above may be the same as the valence of each element in Chemical Formula 1 above. In a case where two elements corresponding the element $E^B$ in Chemical Formula 2 above are represented as an element $E^{B1}$ and an element $E^{B2}$, Chemical Formula 2 above is substantially the same as Chemical Formula 2' below. $\beta$ in Chemical Formula 2' below may be from 0.00 to 1.00.

$$x2(Bi_{1-\alpha}E^A{}_\alpha)(E^{B1}{}_{1-\beta}E^{B2}{}_\beta)O_3-y2BiFeO_3-z2Bi(Fe_{0.5}Ti_{0.5})O_3 \quad (2')$$

$Bi_{x2(1-\alpha)+y2+z2}E^A{}_{x2\alpha}$ in Chemical Formula 2a above corresponds to elements located in the A site of the perovskite structure.

$E^B{}_{x2}Fe_{y2+0.5z2}Ti_{0.5z2}$ in Chemical Formula 2a corresponds to elements located in the B site of the perovskite structure.

Fe constituting y2BiFeO$_3$ in Chemical Formula 2 above has a valence of 3, but Fe constituting z2Bi(Fe$_{0.5}$Ti$_{0.5}$)O$_3$ in Chemical Formula 2 above has a valence of 2. Therefore, the composition of a raw materials for the second piezoelectric layer 3B is adjusted so that the molar ratio of each of Bi, $E^A$, $E^B$, Fe, and Ti in the entire raw material for the second piezoelectric layer 3B is consistent with the molar ratio of each of Bi, $E^A$, $E^B$, Fe, and Ti in Chemical Formula 2 above, and thus the tetragonal crystal 2 can contain Fe$^{2+}$.

x2 in Chemical Formula 2 above may be from 0.10 to 0.85, from 0.10 to 0.80, or from 0.10 to 0.70. In a case where x2 is from 0.10 to 0.85, the tetragonal crystal 2 is likely to have the above-described crystalline orientation, and c2/a2 is likely to fall within the above range.

y2 in Chemical Formula 2 above may be from 0.10 to 0.85. In a case where y2 is from 0.10 to 0.85, the tetragonal crystal 2 is likely to have the above-described crystalline orientation, and c2/a2 is likely to fall within the above range.

z2 in Chemical Formula 2 above may be from 0.05 to 0.80. In a case where z2 is from 0.05 to 0.80, the tetragonal crystal 2 is likely to have the above-described crystalline orientation, and c2/a2 is likely to fall within the above range.

$\alpha$ in Chemical Formula 2 above may be 0.00 or more and less than 1.00. From the viewpoints that the tetragonal crystal 2 is likely to have the above-described crystalline orientation, and c2/a2 is likely to fall within the above range, a may be 0.50. As described above, $\beta$ in Chemical Formula 2' above may be from 0.00 to 1.00 or more than 0.00 and less than 1.00. From the viewpoints that the tetragonal crystal 2 is likely to have the above-described crystalline orientation, and c2/a2 is likely to fall within the above range, $\beta$ may be 0.50.

$\delta$ in Chemical Formula 2a above may be 0 or more. $\delta$ may be a value other than 0 as long as the crystalline structure (perovskite structure) of the tetragonal crystal 2 is maintained. For example, S may be more than 0 and 1.0 or less. $\delta$ may be calculated, for example, from the valence of each ion located in each of the A site and the B site in the tetragonal crystal 2. The valence of each ion may be measured by an XPS method.

The total value of mole numbers of Bi and $E^A$ contained in the tetragonal crystal 2 may be represented as $[A]_2$, the total value of mole numbers of Fe, Ti, and $E^B$ contained in the tetragonal crystal 2 may be represented as $[B]_2$, and $[A]_2/[B]_2$ may be 1.0. $[A]_2/[B]_2$ may be a value other than 1.0 as long as the crystalline structure (perovskite structure) of the tetragonal crystal 2 is maintained. That is, $[A]_2/[B]_2$ may be less than 1.0, or $[A]_2/[B]_2$ may be larger than 1.0.

The tetragonal crystal 1 may be represented by Chemical Formula 1w below. $E^A$ in Chemical Formula 1w below is the element described above. $E^B$ in Chemical Formula 1w below is the element described above. w1 in Chemical Formula 1w below may be from 0.30 to 0.80. $\alpha$ in Chemical Formula 1w below may be 0.00 or more and less than 1.00.

$$(1-w1)Bi_{1-\alpha}E^A{}_\alpha E^B O_3 - w1 BiFeO_3 \qquad (1w)$$

The tetragonal crystal 2 may be represented by Chemical Formula 2w below. $E^A$ in Chemical Formula 2w below is the element described above. $E^B$ in Chemical Formula 2w below is the element described above. w2 in Chemical Formula 2w below may be from 0.30 to 0.80. $\alpha$ in Chemical Formula 2w below may be 0.00 or more and less than 1.00. $E^A$ in Chemical Formula 2w below may be the same as or different from $E^A$ in Chemical Formula 1w above. $E^B$ in Chemical Formula 2w below may be the same as or different from $E^B$ in Chemical Formula 1w above.

$$(1-w2)Bi_{1-\alpha}E^A{}_\alpha E^B O_3 - w2 BiFeO_3 \qquad (2w)$$

The piezoelectric thin film P may be an epitaxial film. That is, the piezoelectric thin film P may be formed by epitaxial growth. The piezoelectric thin film P excellent in anisotropy and crystalline orientation is easily formed by epitaxial growth.

The area of the surface of the first piezoelectric layer 3A may be, for example, from 1 $\mu m^2$ to 500 $mm^2$. The area of each of the crystalline substrate 8, the intermediate layer 5, the first electrode layer 7, the lower layer 6, the second piezoelectric layer 3B, and the second electrode layer 4 may be the same as the area of the first piezoelectric layer 3A.

For example, the composition of the piezoelectric thin film P may be analyzed by an X-ray fluorescence analysis (XRF) method, an inductively coupled plasma (ICP) emission spectroscopy, and an X-ray photoelectron spectroscopy (XPS) method. As a method for specifying the composition and thickness of each of the first piezoelectric layer 3A and the second piezoelectric layer 3B, the composition of the piezoelectric thin film P may be analyzed in the thickness direction of the piezoelectric thin film P by an XPS method. For example, the composition of the surface of the piezoelectric thin film P may be continuously measured by an XPS method while the thickness Tp of the piezoelectric thin film P is uniformly decreased by ion milling or sputtering of the surface of the piezoelectric thin film P. The composition of the cross-section of the piezoelectric thin film P may be analyzed along the thickness direction of the piezoelectric thin film P. In the composition analysis of the cross-section of the piezoelectric thin film P along the thickness direction of the piezoelectric thin film P, an energy dispersive X-ray (EDX) analyzer included in a scanning electron microscope (SEM) or a scanning transmission electron microscope (STEM) may be used. The crystalline structure and crystalline orientation of each of the first piezoelectric layer 3A and the second piezoelectric layer 3B may be specified by the above-described X-ray diffraction (XRD) method. The crystalline structure and the crystalline orientation of each of the lower layer 6, the first piezoelectric layer 3A, and the second piezoelectric layer 3B described above may be a crystalline structure and a crystalline orientation at normal temperature.

In a case where the piezoelectric thin film P consists of the lower layer 6 and the first piezoelectric layer 3A directly stacked on the lower layer 6, the first piezoelectric layer 3A is formed directly on the surface of the lower layer 6 by a first film formation step.

In a case where the piezoelectric thin film P consists of the lower layer 6, the second piezoelectric layer 3B directly stacked on the lower layer 6, and the first piezoelectric layer 3A directly stacked on the second piezoelectric layer 3B, the second piezoelectric layer 3B is formed directly on the surface of the lower layer 6 by a second film formation step, and the first piezoelectric layer 3A is formed directly on the surface of the second piezoelectric layer 3B by the first film formation step subsequent to the second film formation step.

The formation method of the lower layer 6 may be a sputtering method, a vacuum deposition method, a printing method, a spin coat method, or a sol-gel method.

In the first film formation step, the first piezoelectric layer 3A is formed by a pulsed-laser deposition (PLD) method using a first target. The first target is a raw material for the first piezoelectric layer 3A. The first target may be composed of all elements that are common to those of the first piezoelectric layer 3A (tetragonal crystal 1). The composition of the first target may be adjusted so that the molar ratio of each element constituting the first target is consistent with the molar ratio of each element constituting the first piezoelectric layer 3A (tetragonal crystal 1). For example, the molar ratio of each element constituting the first target may be consistent with the molar ratio of each element constituting Chemical Formula 1 or 1' above.

In the second film formation step, the second piezoelectric layer 3B is formed directly on the surface of the lower layer 6 by a PLD method using a second target. The second target is a raw material for the second piezoelectric layer 3B. The second target may be composed of all elements that are common to those of the second piezoelectric layer 3B (tetragonal crystal 2). The composition of the second target may be adjusted so that the molar ratio of each element constituting the second target is consistent with the molar ratio of each element constituting the second piezoelectric layer 3B (tetragonal crystal 2). For example, the molar ratio of each element constituting the second target may be consistent with the molar ratio of each element constituting Chemical Formula 2 or 2' above.

In the PLD method, the target is irradiated with pulse laser light (for example, excimer laser) so that the element constituting the target is converted to a plasma state to evaporate. According to the PLD method, each element constituting the target can be uniformly converted to a plasma state in a moment. As a result, the molar ratio of each element in each piezoelectric layer is likely to be substantially consistent with the molar ratio of each element in each target, and the segregation of the element in each piezoelectric layer is easily suppressed. Furthermore, according to the PLD method, each piezoelectric layer is easily grown epitaxially, and thus each piezoelectric layer that is dense at an atomic level is easily formed. In the PLD method, the growth rate of each piezoelectric layer and the anisotropy and crystalline orientation of the tetragonal crystal constituting each piezoelectric layer can be controlled by changing the number of pulses (repetition frequency) of pulse laser light. With a decrease in repetition frequency of pulse laser light, the growth rate of each piezoelectric layer decreases, and the anisotropy and crystalline orientation of the tetragonal crystal constituting each piezoelectric layer are enhanced.

A repetition frequency f1 of pulse laser light in the first film formation step is smaller than a repetition frequency f2 of pulse laser light in the second film formation step. When f1 is smaller than f2, the piezoelectric thin film P in which c1/a1 of the tetragonal crystal 1 is larger than c2/a2 of the tetragonal crystal 2 can be formed.

The repetition frequency f1 of pulse laser light in the first film formation step may be 10 Hz. By adjusting f1 to 10 Hz, c1/a1 of the tetragonal crystal 1 contained in the first piezoelectric layer 3A is easily controlled within a range from 1.050 to 1.250.

The repetition frequency f2 of pulse laser light in the second film formation step may be 20 Hz. By adjusting f2 to 20 Hz, c2/a2 of the tetragonal crystal 2 contained in the second piezoelectric layer 3B is easily controlled within a range from 1.010 to 1.050.

The first target and the second target may be separately produced by the following method.

As a starting material for each target, for example, an oxide of each of Bi, $E^A$, $E^B$, Fe, and Ti may be used. As the starting material, instead of an oxide, a substance, which becomes an oxide by sintering, such as carbonate or oxalate may be used. After these starting materials are sufficiently dried at 100° C. or higher, each starting material is weighed so that the molar ratio of each of Bi, $E^A$, $E^B$, Fe, and Ti is consistent with the molar ratio of each element in each piezoelectric layer. In the first film formation step and the second film formation step, Bi in the target is likely to volatilize as compared to other elements. Therefore, the molar ratio of Bi in each target may be adjusted to a value higher than the molar ratio of Bi in each piezoelectric layer. In the case of using a raw material containing K as $E^A$ in the first film formation step and the second film formation step, K in the target is likely to volatilize as compared to other elements. Therefore, the molar ratio of K in each target may be adjusted to a value higher than the molar ratio of K in each piezoelectric layer.

The weighed starting materials are sufficiently mixed in an organic solvent or water. The mixing time may be from 5 hours to 20 hours. The mixing means may be, for example, a ball mill. The starting materials obtained after mixing is sufficiently dried, and then the starting materials are molded with a pressing machine. The molded starting materials are calcined to obtain a calcined product. The calcining temperature may be from 750° C. to 900° C. The calcining time may be from 1 hour to 3 hours. The calcined product is pulverized in an organic solvent or water. The pulverization time may be from 5 hours to 30 hours. The pulverization means may be a ball mill. After the calcined product thus pulverized is dried, a powder of the calcined product is obtained by granulating the calcined product added with a binder solution. The powder of the calcined product is subjected to press molding to obtain a block-shaped molded body.

The binder in the molded body volatilizes by heating the block-shaped molded body. The heating temperature may be from 400° C. to 800° C. The heating time may be from 2 hours to 4 hours.

After the volatilization of the binder, the molded body is sintered. The sintering temperature may be from 800° C. to 1100° C. The sintering time may be from 2 hours to 4 hours. The temperature increasing rate and temperature decreasing rate of the molded body in the sintering process may be, for example, from 50° C./hr to 300° C./hr.

The first target and the second target are separately produced by the above steps. The average grain size of crystal grains of the oxide (perovskite-type oxide) contained in each target may be, for example, from 1 μm to 20 μm. Each target contains $Fe^{3+}$, but each target does not have to contain $Fe^{2+}$ necessarily. In the first film formation step, a part of $Fe^{3+}$ derived from the first target is reduced so that the first piezoelectric layer 3A containing $Fe^{2+}$ can be obtained. In the second film formation step, a part of $Fe^{2+}$ derived from the second target is reduced so that the second piezoelectric layer 3B containing $Fe^{2+}$ can be obtained.

In the first film formation step, elements constituting the first target are evaporated in a vacuum atmosphere by the PLD method. The evaporated elements are attached and deposited to the surface of the lower layer 6 or the second piezoelectric layer 3B to form the first piezoelectric layer 3A.

In the second film formation step, elements constituting the second target are evaporated in a vacuum atmosphere by the PLD method. The evaporated elements are attached and deposited to the surface of the lower layer 6 to form the second piezoelectric layer 3B.

In the first film formation step, the first piezoelectric layer 3A may be formed in a vacuum chamber while the inside of the vacuum chamber is heated. For example, the temperature (film-forming temperature) inside the vacuum chamber may be from 450° C. to 600° C. When the film-forming temperature is 450° C. or higher, a part of $Fe^{3+}$ derived from the first target is easily reduced, and thus the first piezoelectric layer 3A containing $Fe^{2+}$ is easily formed. In a case where the film-forming temperature is lower than 450° C., $Fe^{3+}$ derived from the target is difficult to be reduced, and thus the first piezoelectric layer 3A containing $Fe^{2+}$ is difficult to be obtained. As the film-forming temperature increases, cleanliness of the surface of the lower layer 6 or the second piezoelectric layer 3B is improved, and thus the crystallinity of the first piezoelectric layer 3A is enhanced, so that the orientation degree of the crystal plane of the tetragonal crystal 1 is easily increased. In a case where the film-forming temperature is excessively high, each element constituting the first piezoelectric layer 3A is excessively reduced, and thus the first piezoelectric layer 3A having a desired composition is difficult to be obtained. Furthermore, in a case where the film-forming temperature is excessively high, Bi or K is likely to be desorbed from the first piezoelectric layer 3A, and thus the composition of the first piezoelectric layer 3A is difficult to be controlled.

The oxygen partial pressure in the vacuum chamber may be, for example, from 0.1 Pa to 3.0 Pa, preferably from 0.1 Pa to 1.0 Pa, and more preferably from 0.1 to 0.5 Pa. When the oxygen partial pressure is maintained within the above ranges, a part of $Fe^{3+}$ derived from the target is easily reduced, and thus the first piezoelectric layer 3A containing $Fe^{2+}$ is easily formed. In a case where the oxygen partial pressure is excessively low, each element derived from the target is difficult to be sufficiently oxidized, and thus the perovskite-type oxide is difficult to be formed, so that the orientation degree of the crystal plane of the tetragonal crystal 1 is likely to decrease. In a case where the oxygen partial pressure is excessively high, $Fe^{3+}$ derived from the target is difficult to be reduced, and thus the first piezoelectric layer 3A containing $Fe^{2+}$ is difficult to be obtained. Furthermore, in a case where the oxygen partial pressure is excessively high, the growth rate of the first piezoelectric layer 3A is likely to decrease, and thus the orientation degree of the crystal plane of the tetragonal crystal 1 is likely to decrease.

In the first film formation step, in addition to the repetition frequency f1 of pulse laser light, the number of times of irradiation of the first target with pulse laser light (film formation time) may be controlled. With an increase in the number of times of irradiation of the first target with pulse laser light (film formation time), the thickness of the first piezoelectric layer 3A tends to increase. In the first film formation step, in addition to the repetition frequency f1 of pulse laser light, a distance between the surface of the lower layer 6 or the second piezoelectric layer 3B and the first target may be controlled. With a decrease in distance between the surface of the lower layer 6 or the second piezoelectric layer 3B and the first target, the thickness and growth rate of the first piezoelectric layer 3A tend to increase.

The second film formation step may be performed by substantially the same method as that of the first film formation step except for the composition of the target and the repetition frequency of pulse laser light.

After the piezoelectric thin film P is formed by the first film formation step (and the second film formation step), an annealing treatment (heating treatment) of the piezoelectric thin film P may be performed. The temperature (annealing temperature) of the piezoelectric thin film P in the annealing treatment may be, for example, from 300° C. to 1000° C., from 600° C. to 1000° C., or from 850° C. to 1000° C. The piezoelectric properties of the piezoelectric thin film P tend to be further improved by the annealing treatment of the piezoelectric thin film P. The piezoelectric properties of the piezoelectric thin film P are easily improved by the annealing treatment particularly at a temperature from 850° C. to 1000° C. However, the annealing treatment is not essential. The annealing treatment may be performed in a reductive atmosphere such as nitrogen gas ($N_2$). The oxidation of $Fe^{2+}$ (generation of $Fe^{3+}$) in the piezoelectric thin film P associated with the annealing treatment is suppressed by the annealing treatment in a reductive atmosphere, and thus $Fe^{2+}$ in the piezoelectric thin film P is likely to be maintained.

In the formation process of the piezoelectric thin film P described above and a temperature decreasing process subsequent thereto, the compressive stress due to a change in temperature may be generated in the piezoelectric thin film P. The piezoelectric thin film P is compressed by the compressive stress in directions (a-axis direction and b-axis direction) substantially parallel to the surface of the first piezoelectric layer 3A. As a result, the tetragonal crystal 1 (and the tetragonal crystal 2) is likely to be formed.

The crystalline substrate 8 may be a single-crystal substrate. For example, the crystalline substrate 8 may be a substrate consisting of a single crystal of Si or a substrate consisting of a single crystal of a compound semiconductor such as GaAs. The crystalline substrate 8 may be a substrate consisting of a single crystal of an oxide. The single crystal of an oxide may be, for example, MgO or a perovskite-type oxide (for example, $SrTiO_3$). The thickness of the crystalline substrate 8 may be, for example, from 10 μm to 1000 μm. In a case where the crystalline substrate 8 has electrical conductivity, the crystalline substrate 8 functions as an electrode, and thus the first electrode layer 7 does not have to be provided. For example, the crystalline substrate 8 having electrical conductivity may be a single crystal of $SrTiO_3$ doped with niobium (Nb). A SOI (Silicon-on-Insulator) substrate may be used as the crystalline substrate 8.

A crystal orientation of the crystalline substrate 8 may be equal to the normal direction $D_W$ of the surface of the crystalline substrate 8. That is, the surface of the crystalline substrate 8 may be parallel to a crystal plane of the crystalline substrate 8. The crystalline substrate 8 may be a uniaxially oriented substrate. For example, a (100) plane of the crystalline substrate 8 such as Si may be parallel to the surface of the crystalline substrate 8. That is, a [100] direction of the crystalline substrate 8 such as Si may be parallel to the normal direction $D_N$ of the surface of the crystalline substrate 8.

In a case where the (100) plane of the crystalline substrate 8 such as Si is parallel to the surface of the crystalline substrate 8, the (001) plane of each of the tetragonal crystal 1 and the tetragonal crystal 2 is likely to be oriented in the normal direction dn of the surface of the first piezoelectric layer 3A.

As described above, the intermediate layer 5 (first intermediate layer) may be disposed between the crystalline substrate 8 and the first electrode layer 7. The intermediate layer 5 may contain, for example, at least one selected from the group consisting of titanium (Ti), chromium (Cr), titanium oxide ($TiO_2$), silicon oxide ($SiO_2$), and zirconium oxide ($ZrO_2$). The first electrode layer 7 is easily in close contact with the crystalline substrate 8 with the intermediate layer 5 interposed therebetween. The intermediate layer 5 may be crystalline. A crystal plane of the intermediate layer 5 may be oriented in the normal direction $D_N$ of the surface of the crystalline substrate 8. Both of the crystal plane of the crystalline substrate 8 and the crystal plane of the intermediate layer 5 may be oriented in the normal direction $D_N$ of the surface of the crystalline substrate 8. The formation method of the intermediate layer 5 may be a sputtering method, a vacuum deposition method, a printing method, a spin coat method, or a sol-gel method.

The intermediate layer 5 may contain $ZrO_2$ and an oxide of a rare-earth element. When the intermediate layer 5 contains $ZrO_2$ and an oxide of a rare-earth element, the first electrode layer 7 consisting of a platinum crystal is likely to be formed on the surface of the intermediate layer 5, a (002) plane of the platinum crystal is likely to be oriented in the normal direction of the surface of the first electrode layer 7, and a (200) plane of the platinum crystal is likely to be oriented in the in-plane direction of the surface of the first electrode layer 7. The rare-earth element may be at least one selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The intermediate layer 5 may contain $ZrO_2$ and $Y_2O_3$. For example, the intermediate layer 5 may consist of yttria-stabilized zirconia ($ZrO_2$ added with $Y_2O_3$). The intermediate layer 5 may have a first layer consisting of $ZrO_2$ and a second layer consisting of $Y_2O_3$. The first layer consisting of $ZrO_2$ may be directly laminated on the surface of the crystalline substrate 8. The second layer consisting of $Y_2O_3$ may be directly laminated on the surface of the first layer. The first electrode layer 7 may be directly laminated on the surface of the second layer consisting of $Y_2O_3$. In a case where the intermediate layer 5 contains $ZrO_2$ and $Y_2O_3$, the first piezoelectric layer 3A (and the second piezoelectric layer 3B) is likely to be epitaxially grown, and thus the (001) plane of the tetragonal crystal 1 (and the (001) plane of the tetragonal crystal 2) is likely to be oriented preferentially in the normal direction dn of the surface of the first piezoelectric layer 3A. Furthermore, in a case where the intermediate layer 5 contains $ZrO_2$ and $Y_2O_3$, the first electrode layer 7 consisting of a platinum crystal is likely to be formed on the surface of the intermediate layer 5, the (002) plane of the platinum crystal is likely to be oriented in the normal direction of the surface of the first electrode layer 7, and the (200) plane of the platinum crystal is likely to be oriented in the in-plane direction of the surface of the first electrode layer 7.

The first electrode layer 7 may consist of, for example, at least one metal selected from the group consisting of platinum (Pt), palladium (Pd), rhodium (Rh), gold (Au), ruthenium (Ru), iridium (Ir), molybdenum (Mo), titanium (Ti), tantalum (Ta), and nickel (Ni). The first electrode layer 7 may consist of, for example, a conductive metal oxide such as strontium ruthenate ($SrRuO_3$), lanthanum nickel oxide ($LaNiO_3$), or lanthanum strontium cobalt oxide ((La,Sr)$CoO_3$). The first electrode layer 7 may be crystalline. A crystal plane of the first electrode layer 7 may be oriented in the normal direction $D_N$ of the crystalline substrate 8. That is, the crystal plane of the first electrode layer 7 may be substantially parallel to the surface of the crystalline substrate 8. Both of the crystal plane of the crystalline substrate 8 and the crystal plane of the first electrode layer 7 may be oriented in the normal direction $D_N$ of the crystalline substrate 8. The crystal plane of the first electrode layer 7 oriented in the normal direction $D_N$ of the crystalline substrate 8 may be substantially parallel to the (001) plane of the tetragonal crystal 1 (and the (001) plane of the tetragonal crystal 2). The thickness of the first electrode layer 7 may be, for example, from 1 nm to 1.0 μm. The formation method of the first electrode layer 7 may be a sputtering method, a vacuum deposition method, a printing method, a spin coat method, or a sol-gel method. In the case of a printing method, a spin coat method, or a sol-gel method, the heating treatment (annealing) of the first electrode layer 7 may be performed in order to enhance the crystallinity of the first electrode layer 7.

The first electrode layer 7 may contain a platinum crystal. The first electrode layer 7 may consist of a platinum crystal. The platinum crystal is a cubic crystal having a face-centered cubic lattice structure (fcc structure). The (002) plane of the platinum crystal may be oriented in the normal direction of the surface of the first electrode layer 7, and the (200) plane of the platinum crystal may be oriented in the in-plane direction of the surface of the first electrode layer 7. In other words, the (002) plane of the platinum crystal may be substantially parallel to the surface of the first electrode layer 7, and the (200) plane of the platinum crystal may be substantially perpendicular to the surface of the first electrode layer 7. In a case where the (002) plane and the (200) plane of the platinum crystal constituting the first electrode layer 7 have the above-described orientation, the first piezoelectric layer 3A (and the second piezoelectric layer 3B) is likely to be epitaxially grown, and thus the (001) plane of the tetragonal crystal 1 (and the (001) plane of the tetragonal crystal 2) is likely to be oriented preferentially in the normal direction dn of the surface of the first piezoelectric layer 3A. The surface of the first electrode layer 7 may be substantially parallel to the surface of the first piezoelectric layer 3A. That is, the normal direction of the surface of the first electrode layer 7 may be substantially parallel to the normal direction dn of the surface of the first piezoelectric layer 3A.

The second electrode layer 4 may consist of, for example, at least one metal selected from the group consisting of Pt, Pd, Rh, Au, Ru, Ir, Mo, Ti, Ta, and Ni. The second electrode layer 4 may consist of, for example, at least one conductive metal oxide selected from the group consisting of $LaNiO_3$, $SrRuO_3$, and (La,Sr)$CoO_3$. The second electrode layer 4 may be crystalline. A crystal plane of the second electrode layer 4 may be oriented in the normal direction $D_N$ of the crystalline substrate 8. The crystal plane of the second electrode layer 4 may be substantially parallel to the surface of the crystalline substrate 8. The crystal plane of the second electrode layer 4 oriented in the normal direction $D_N$ of the crystalline substrate 8 may be substantially parallel to the (001) plane of the tetragonal crystal 1 (and the (001) plane of the tetragonal crystal 2). The thickness of the second electrode layer 4 may be, for example, from 1 nm to 1.0 μm. The formation method of the second electrode layer 4 may be a sputtering method, a vacuum deposition method, a printing method, a spin coat method, or a sol-gel method. In the case of a printing method, a spin coat method, or a sol-gel method, the heating treatment (annealing) of the second electrode layer 4 may be performed in order to enhance the crystallinity of the second electrode layer 4.

Another intermediate layer (second intermediate layer) may be disposed between the piezoelectric thin film P (first piezoelectric layer 3A) and the second electrode layer 4. The second electrode layer 4 is easily in close contact with the piezoelectric thin film P (first piezoelectric layer 3A) with the other intermediate layer interposed therebetween. The composition, crystalline structure, and formation method of the other intermediate layer (second intermediate layer) may be the same as those of the intermediate layer (first intermediate layer) described above. The other intermediate layer may contain, for example, at least one selected from the group consisting of $SrRuO_3$, $LaNiO_3$, and (La,Sr)$CoO_3$. The formation method of the other intermediate layer may be a sputtering method, a vacuum deposition method, a printing method, a spin coat method, or a sol-gel method.

At least a part or whole of the surface of the piezoelectric thin film element 10 may be coated with a protective film. The durability (such as moisture resistance) of the piezoelectric thin film element 10 is improved by coating with the protective film.

A piezoelectric thin film element according to the present embodiment is used for various applications. For example, the piezoelectric thin film element may be used in a piezoelectric transducer and a piezoelectric sensor. That is, a piezoelectric transducer (for example, an ultrasonic transducer) according to the present embodiment may contain the above-described the piezoelectric thin film element. The piezoelectric transducer may be, for example, an ultrasonic transducer such as an ultrasonic sensor. The piezoelectric thin film element may be, for example, a harvester (vibration energy harvester). As described above, the piezoelectric thin film element according to the present embodiment has an excellent piezoelectric performance index, and thus the piezoelectric thin film element according to the present embodiment is suitable for an ultrasonic transducer. The piezoelectric thin film element may be a piezoelectric actuator. The piezoelectric actuator may be used in a head assembly, a head stack assembly, or a hard disk drive. The piezoelectric actuator may be used in a printer head or an ink jet printer. The piezoelectric actuator may be a piezoelectric switch. The piezoelectric actuator may be used in haptics.

That is, the piezoelectric actuator may be used in various devices requiring cutaneous sensory (tactile) feedback. The device requiring cutaneous sensory feedback may be, for example, a wearable device, a touch pad, a display, or a game controller. The piezoelectric thin film element may be a piezoelectric sensor. For example, the piezoelectric sensor may be a piezoelectric microphone, a gyroscope sensor, a pressure sensor, a pulse sensor, or a shock sensor. The piezoelectric thin film element may be a SAW filter, a BAW filter, an oscillator, or an acoustic multi-layer film. Micro electro mechanical systems (MEMS) according to the present embodiment contain the above-described piezoelectric thin film element. That is, the piezoelectric thin film element may be a part or whole of the micro electro mechanical systems. For example, the piezoelectric thin film element may be a part or whole of piezoelectric micromachined ultrasonic transducers (PMUT). For example, products to which piezoelectric micromachined ultrasonic transducers are applied may be biometric sensors (such as a fingerprint authentication sensor and a vessel authentication sensor) or medical/healthcare sensors (such as a blood-pressure gauge and a vessel imaging sensor), or ToF (Time of Flight) sensors.

Figure 9:
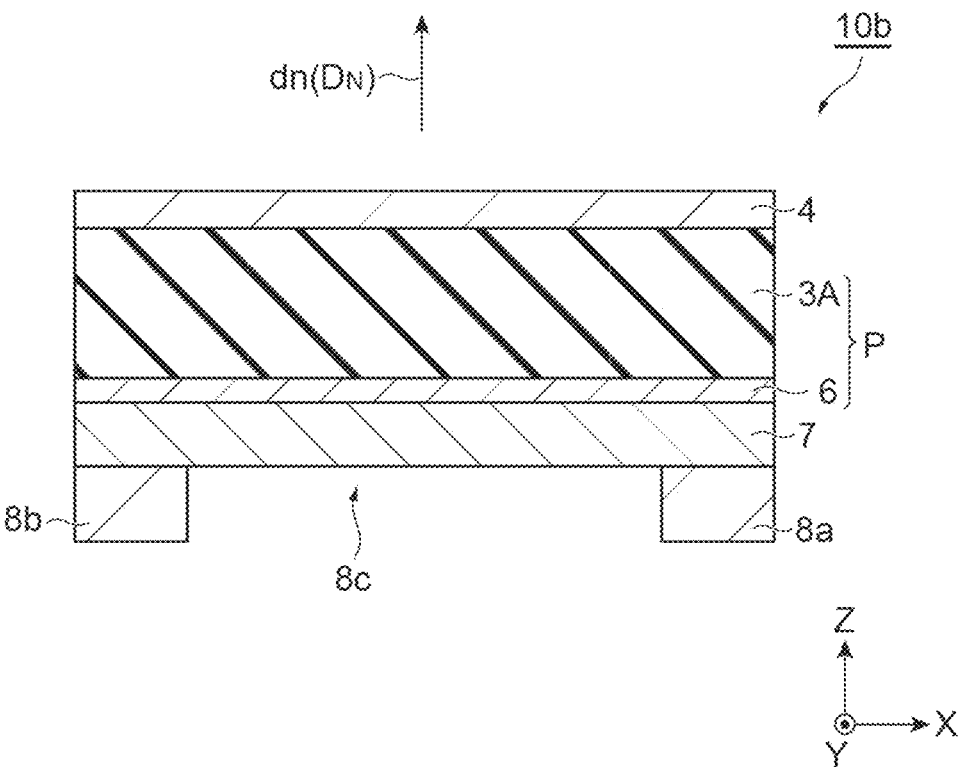
FIG. 9 is a schematic cross-sectional view of a piezoelectric thin film element (ultrasonic transducer) according to still another embodiment of the present invention.

FIG. 9 illustrates a schematic cross-section of an ultrasonic transducer 10b containing the above-described piezoelectric thin film element. The cross-section of this ultrasonic transducer 10b is perpendicular to the surface of the piezoelectric thin film P (first piezoelectric layer 3A). The ultrasonic transducer 10b may contain a substrate (8a and 8b), the first electrode layer 7 provided on the substrate (8a and 8b), the piezoelectric thin film P stacked on the first electrode layer 7, and the second electrode layer 4 stacked on the piezoelectric thin film P. The piezoelectric thin film P contains the lower layer 6 directly stacked on the first electrode layer 7 and the first piezoelectric layer 3A stacked on the lower layer 6. An acoustic cavity 8c may be provided below the piezoelectric thin film P. An ultrasonic signal is transmitted or received by deflection or vibration of the piezoelectric thin film P. The second piezoelectric layer 3B may be disposed between the lower layer 6 and the first piezoelectric layer 3A. The intermediate layer may be interposed between the substrate (8a and 8b) and the first electrode layer 7.

EXAMPLES

The present invention will be specifically explained by the following Examples and Comparative Examples. The present invention is not limited by the following Examples.

Example 1

A crystalline substrate consisting of Si was used in the production of a piezoelectric thin film element of Example 1. A (100) plane of Si was parallel to the surface of the crystalline substrate. The crystalline substrate had a square shape of 20 mm×20 mm. The thickness of the crystalline substrate was 500 μm.

A crystalline intermediate layer consisting of $ZrO_2$ and $Y_2O_3$ was formed on the entire surface of the crystalline substrate in a vacuum chamber. The intermediate layer was formed by a sputtering method. The thickness of the intermediate layer was 30 nm.

A first electrode layer consisting of a Pt crystal was formed on the entire surface of the intermediate layer in the vacuum chamber. The first electrode layer was formed by a sputtering method. The thickness of the first electrode layer was 200 nm. The temperature inside the vacuum chamber in the formation process of the first electrode layer was maintained at 500° C.

An XRD pattern of the first electrode layer was measured by out-of-plane measurement in the surface of the first electrode layer. Another XRD pattern of the first electrode layer was measured by in-plane measurement in the surface of the first electrode layer. In the measurement of these XRD patterns, an X-ray diffraction apparatus (SmartLab) manufactured by Rigaku Corporation was used. Measurement conditions were set such that each peak intensity in each XRD pattern is higher than the background intensity by at least triple digits or more. A peak of diffracted X-rays of (002) planes of the Pt crystal was detected by out-of-plane measurement. That is, the (002) planes of the Pt crystal were oriented in the normal direction of the surface of the first electrode layer. A peak of diffracted X-rays of the (200) planes of the Pt crystal was detected by in-plane measurement. That is, the (200) planes of the Pt crystal were oriented in the in-plane direction of the surface of the first electrode layer.

A crystalline lower layer was formed on the entire surface of the first electrode layer. The lower layer was formed by a sputtering method. The composition of the lower layer is shown in Table 1 below. The thickness TL of the lower layer was adjusted to a value shown in Table 2 below.

By performing the above-described first film formation step (PLD method) in the vacuum chamber, a first piezoelectric layer was formed on the entire surface of the lower layer. The repetition frequency f1 of pulse laser light in the first film formation step was adjusted to 10 Hz. The oxygen partial pressure in the vacuum chamber in the first film formation step was maintained at 1 Pa. The temperature (film-forming temperature) inside the vacuum chamber in the formation process of the first piezoelectric layer was maintained at 460° C. The thickness T1 of the first piezoelectric layer was adjusted to a value shown in Table 2 below.

The composition of the first target used in the first film formation step is represented by Chemical Formula 1' below. In the case of Example 1, $E^A$, $E^{B1}$, and $E^{B2}$ in Chemical Formula 1' below were elements shown in Table 1 below. In the case of Example 1, $\alpha$, $\beta$, x1, y1, and z1 in Chemical Formula 1' below were values shown in Table 1 below.

$$x1(Bi_{1-\alpha}E^A_{\alpha})(E^{B1}_{1-\beta}E^{B2}_{\beta})O_3 - y1BiFeO_3 - z1Bi(Fe_{0.5}Ti_{0.5})O_3 \qquad (1')$$

A piezoelectric thin film consisting of the lower layer and the first piezoelectric layer was formed by the above-described first film formation step. For the following analysis and measurement, a plurality of piezoelectric thin films were formed by the above-described method.

The composition of the piezoelectric thin film was continuously analyzed along the thickness direction of the piezoelectric thin film while the thickness of the piezoelectric thin film was uniformly decreased by sputtering of the surface of the piezoelectric thin film. The composition of the piezoelectric thin film was analyzed by an XPS method. The result of the analysis shows that the composition of the first piezoelectric layer is consistent with the composition of the first target.

An XRD pattern of the piezoelectric thin film was measured by out-of-plane measurement in the surface of the first piezoelectric layer using the above-described X-ray diffraction apparatus. Further, another XRD pattern of the piezoelectric thin film was measured by in-plane measurement in the surface of the first piezoelectric layer. A reciprocal space mapping of the piezoelectric thin film was performed by these measurements. Measurement conditions were set such that each peak intensity in each XRD pattern is higher than the background intensity by at least triple digits or more. The measurement apparatus and measurement conditions of each XRD pattern were the same conditions as described above. A cross-section of the piezoelectric thin film parallel to the thickness direction of the piezoelectric thin film was observed using a scanning transmission electron microscope (STEM) with the resolution of an atomic level.

The results of analysis using the X-ray diffraction apparatus and the STEM showed that the piezoelectric thin film had the following features.

(001) planes of the lower crystal constituting the lower layer were oriented in the normal direction of the surface of the first piezoelectric layer.

The first piezoelectric layer consisted of a tetragonal crystal 1 of a perovskite-type oxide.

(001) planes of the tetragonal crystal 1 were oriented preferentially in the normal direction of the surface of the first piezoelectric layer. That is, the orientation degree of the (001) plane of the tetragonal crystal 1 in the normal direction of the surface of the first piezoelectric layer was 90% or more. As described above, the orientation degree of the (001) plane of the tetragonal crystal 1 is represented as $100 \times I_{1(001)}/I_{1(001)}+I_{1(110)}+I_{1(111)}$. The crystal plane of the tetragonal crystal 1 oriented preferentially in the normal direction of the surface of the first piezoelectric layer is described as "first oriented plane".

The spacing aL of (100) planes of the lower crystal constituting the lower layer was a value shown in Table 1 below.

The spacing a1 of (100) planes of the tetragonal crystal 1 constituting the first piezoelectric layer was a value shown in Table 1 below.

The lattice mismatch rate Δa was a value shown in Table 1 below. As described above, the lattice mismatch rate Δa is defined as $100 \times (aL-a1)/a1$.

The full width at half maximum (FWHM) of the rocking curve of diffracted X-rays derived from (001) planes of the tetragonal crystal 1 was a value shown in Table 1 below. The rocking curve of diffracted X-rays derived from (001) planes of the tetragonal crystal 1 of Example 1 is shown in FIG. 10.

c1/a1 of the tetragonal crystal 1 was a value shown in Table 2 below.

A laminate, which is composed of the crystalline substrate, the intermediate layer directly stacked on the crystalline substrate, the first electrode layer directly stacked on the intermediate layer, and the piezoelectric thin film (a lower layer and a first piezoelectric layer) directly stacked on the first electrode layer, was produced by the above-described method. The following step was further performed using this laminate.

A second electrode layer consisting of Pt was formed on the entire surface of the piezoelectric thin film in the vacuum chamber. The second electrode layer was formed by a sputtering method. The temperature of the crystalline substrate in the formation process of the second electrode layer was maintained at 500° C. The thickness of the second electrode layer was 200 nm.

A laminate, which is composed of the crystalline substrate, the intermediate layer directly stacked on the crystalline substrate, the first electrode layer directly stacked on the intermediate layer, the lower layer directly stacked on the first electrode layer, the first piezoelectric layer directly stacked on the lower layer, and the second electrode layer directly stacked on the first piezoelectric layer, was produced by the above steps. The laminate structure on the crystalline substrate was patterned by the subsequent photolithography. After the patterning, the laminate was cut by dicing.

A piezoelectric thin film element having a quadrangular shape of Example 1 was obtained by the above steps. The piezoelectric thin film element was composed of the crystalline substrate, the intermediate layer directly stacked on the crystalline substrate, the first electrode layer directly stacked on the intermediate layer, the lower layer directly stacked on the first electrode layer, the first piezoelectric layer directly stacked on the lower layer, and the second electrode layer directly stacked on the first piezoelectric layer. The area of the movable part of the piezoelectric thin film was 600 μm×600 μm.

<Evaluation of Piezoelectric Properties>

Piezoelectric properties of the piezoelectric thin film were evaluated by the following method.

[Calculation of Relative Permittivity]

The capacitance C of the piezoelectric thin film element was measured. The details of measurement of the capacitance C was as described below.

Measurement apparatus: Impedance Gain-Phase Analyzer 4194A manufactured by Hewlett Packard Enterprise Development LP Frequency: 1 kHz Electric field: 10 V/μm The relative permittivity $\varepsilon_r$ was calculated based on Mathematical Formula A below from the measured value of the capacitance C. $\varepsilon_r$ of Example 1 is shown in Table 2 below.

$$C=\varepsilon_0 \times \varepsilon_r \times (S/d) \tag{A}$$

$\varepsilon_0$ in Mathematical Formula A is a permittivity of vacuum ($8.854 \times 10^{-12}$ Fm$^{-1}$). S in Mathematical Formula A is an area of the surface of the piezoelectric thin film. S is restated as an area of the first electrode layer stacked on the piezoelectric thin film. d in Mathematical Formula A is a thickness of the piezoelectric thin film.

[Measurement of Piezoelectric Strain Constant $d_{33,f}$]

The piezoelectric strain constant $d_{33,f}$ of the piezoelectric thin film was measured using the piezoelectric thin film element. The details of measurement of $d_{33,f}$ was as described below. The piezoelectric strain constant $d_{33,f}$ (average value of three measurement points) of Example 1 is shown in Table 2 below. The piezoelectric performance index ($d_{33,f}/\varepsilon_r\varepsilon_0$) was calculated from $d_{33,f}$ and $\varepsilon_r$. $d_{33,f}/\varepsilon_r\varepsilon_0$ of Example 1 is shown in Table 2 below.

Measurement apparatus: $d_{33}$ meter (ZJ-4B) manufactured by Chinese Academy of Sciences Frequency: 110 Hz Clamping pressure: 0.25 N Examples 2 to 11 and Comparative Examples 1 to 8

The composition of the lower layer of each of Examples 2 to 11 and Comparative Examples 6 to 8 is shown in Table 1 below. The thickness TL of the lower layer of each of Examples 2 to 11 and Comparative Examples 6 to 8 was adjusted to a value shown in Table 2 below. The lower layer of each of Comparative Examples 1 to 5 was not formed. That is, the first piezoelectric layer of each of Comparative Examples 1 to 5 was formed directly on the surface of the first electrode layer.

The thickness T1 of the first piezoelectric layer of each of Examples 2 to 11 and Comparative Examples 1 to 8 was adjusted to a value shown in Table 2 below. The composition of the first target of each of Examples 2 to 11 and Comparative Examples 1 to 8 is represented by Chemical Formula 1' above. $E^A$, $E^{B1}$, and $E^{B2}$ of each of Examples 2 to 11 and Comparative Examples 1 to 8 were elements shown in Table 1 below. $\alpha$, $\beta$, x1, y1, and z1 of each of Examples 2 to 11 and Comparative Examples 1 to 8 were values shown in Table 1 below.

A piezoelectric thin film element of each of Examples 2 to 11 and Comparative Examples 1 to 8 was produced by the same method as in Example 1 except for the above matters.

Measurement for the first electrode layer of each of Examples 2 to 11 and Comparative Examples 1 to 8 was performed by the same method as in Example 1. In all cases of Examples 2 to 11 and Comparative Examples 1 to 8, the (002) planes of the Pt crystal constituting the first electrode layer were oriented in the normal direction of the surface of the first electrode layer, and the (200) planes of the Pt crystal were oriented in the in-plane direction of the surface of the first electrode layer.

Analysis and measurement for the piezoelectric thin film of each of Examples 2 to 11 and Comparative Examples 1 to 8 were performed by the same method as in Example 1.

In all cases of Examples 2 to 11 and Comparative Examples 1 to 8, the composition of the first piezoelectric layer was consistent with the composition of the first target.

In all cases of Examples 2 to 11 and Comparative Examples 6 to 8, the (001) planes of the lower crystal constituting the lower layer were oriented in the normal direction of the surface of the first piezoelectric layer.

In all cases of Examples 2 to 11 and Comparative Examples 1 to 8, the first piezoelectric layer consisted of the tetragonal crystal 1 of the perovskite-type oxide.

In all cases of Examples 2 to 11 and Comparative Examples 1 to 8, the (001) planes of the tetragonal crystal 1 were oriented preferentially in the normal direction of the surface of the first piezoelectric layer.

aL, a1, $\Delta a$, and FWHM of each of Examples 2 to 11 and Comparative Examples 1 to 8 were values shown in Table 1 below. However, only in the cases of Comparative Examples 1 to 5 and Comparative Example 10 described below, aL is not the spacing of the (100) planes of the lower crystal constituting the lower layer but is the spacing of the (100) planes of the Pt crystal constituting the first electrode layer.

c1/a1 of each of Examples 2 to 11 and Comparative Examples 1 to 8 was a value shown in Table 2 below.

The piezoelectric properties of the piezoelectric thin film of each of Examples 2 to 11 and Comparative Examples 1 to 8 were evaluated by the same method as in Example 1. $\varepsilon_r$, $d_{33,f}$ and $d_{33,f}/\varepsilon_r \varepsilon_0$ of each of Examples 2 to 11 and Comparative Examples 1 to 8 were shown in Table 2 below.

TABLE 1

| Table 1 Unit | $E^A$ — | $E^{B1}$ — | $E^{B2}$ — | $\alpha$ — | $\beta$ — | x1 — | y1 — | z1 — | a1 Å | aL Å | $\Delta a$ % | Lower layer — | First oriented plane — | FWHM deg. |
|---|---|---|---|---|---|---|---|---|---|---|---|---|---|---|
| Example 1 | K | Ti | None | 0.5 | 0 | 0.15 | 0.80 | 0.05 | 3.81 | 3.99 | 4.51 | BaTiO$_3$ | (001) | 2.3 |
| Example 2 | K | Ti | None | 0.5 | 0 | 0.10 | 0.85 | 0.05 | 3.73 | 4.24 | 12.03 | TiN | (001) | 2.4 |
| Example 3 | Ag | Mg | Ti | 0.5 | 0.5 | 0.15 | 0.05 | 0.80 | 3.87 | 3.99 | 3.01 | BaTiO$_3$ | (001) | 2.8 |
| Example 4 | K | Zn | Zr | 0.5 | 0.5 | 0.85 | 0.10 | 0.05 | 3.88 | 4.24 | 8.49 | TiN | (001) | 1.9 |
| Example 5 | K | Zn | Ti | 0.5 | 0.5 | 0.30 | 0.65 | 0.05 | 3.78 | 3.99 | 5.26 | BaTiO$_3$ | (001) | 1.9 |
| Example 6 | None | Al | None | 0 | 0 | 0.20 | 0.10 | 0.70 | 3.92 | 4.24 | 7.55 | TiN | (001) | 4.6 |
| Example 7 | Na | Ni | Ti | 0.5 | 0.5 | 0.25 | 0.15 | 0.60 | 3.88 | 4.24 | 8.49 | TiN | (001) | 5.5 |
| Example 8 | None | Mg | Ti | 0 | 0.5 | 0.15 | 0.35 | 0.50 | 3.75 | 3.99 | 6.02 | BaTiO$_3$ | (001) | 3.7 |
| Example 9 | None | Zn | Ti | 0 | 0.5 | 0.30 | 0.50 | 0.20 | 3.81 | 3.99 | 4.51 | BaTiO$_3$ | (001) | 2.6 |
| Example 10 | None | Zn | Ti | 0 | 0.5 | 0.30 | 0.50 | 0.20 | 3.81 | 4.24 | 10.14 | TiN | (001) | 3.5 |
| Example 11 | None | Zn | Ti | 0 | 0.5 | 0.30 | 0.50 | 0.20 | 3.81 | 3.93 | 3.05 | SrRuO$_3$ | (001) | 1.9 |
| Comparative Example 1 | K | Ti | None | 0.5 | 0 | 0.15 | 0.80 | 0.05 | 3.83 | 3.91 | 2.05 | None | (001) | 1.4 |
| Comparative Example 2 | Ag | Mg | Ti | 0.5 | 0.5 | 0.15 | 0.05 | 0.80 | 3.89 | 3.91 | 0.51 | None | (001) | 1.5 |
| Comparative Example 3 | K | Zn | Zr | 0.5 | 0.5 | 0.85 | 0.10 | 0.05 | 3.90 | 3.91 | 0.26 | None | (001) | 0.9 |
| Comparative Example 4 | None | Al | None | 0 | 0 | 0.20 | 0.10 | 0.70 | 3.92 | 3.91 | −0.26 | None | (001) | 0.8 |
| Comparative Example 5 | Na | Ni | Ti | 0.5 | 0.5 | 0.25 | 0.15 | 0.60 | 3.91 | 3.91 | 0.00 | None | (001) | 1.2 |
| Comparative Example 6 | None | Al | None | 0 | 0 | 0.30 | 0.50 | 0.20 | 3.85 | 4.45 | 13.48 | MnO | (001) | 6.2 |
| Comparative Example 7 | K | Ti | None | 0.5 | 0 | 0.70 | 0.20 | 0.10 | 3.94 | 4.24 | 7.08 | TiN | (001) | 5.6 |
| Comparative Example 8 | K | Ti | None | 0.5 | 0 | 1.00 | 0.00 | 0.00 | 3.91 | 3.99 | 2.01 | BaTiO$_3$ | (001) | 3.9 |

TABLE 2

| Table 2 Unit | $\Delta a$ % | FWHM deg. | $\varepsilon_r$ — | $d_{33,f}$ pC/N | $d_{33,f}/\varepsilon_0\varepsilon_r \times 10^{-3}$ V·m/N | c1/a1 — | T1 nm | TL nm |
|---|---|---|---|---|---|---|---|---|
| Example 1 | 4.51 | 2.3 | 111 | 165 | 168 | 1.240 | 3000 | 30 |
| Example 2 | 12.03 | 2.4 | 118 | 174 | 167 | 1.249 | 3000 | 10 |
| Example 3 | 3.01 | 2.8 | 112 | 158 | 159 | 1.201 | 2220 | 150 |
| Example 4 | 8.49 | 1.9 | 105 | 168 | 181 | 1.130 | 3800 | 300 |
| Example 5 | 5.26 | 1.9 | 121 | 173 | 161 | 1.130 | 4600 | 350 |
| Example 6 | 7.55 | 4.6 | 111 | 159 | 162 | 1.079 | 4920 | 180 |
| Example 7 | 8.49 | 5.5 | 114 | 156 | 155 | 1.066 | 1690 | 80 |
| Example 8 | 6.02 | 3.7 | 112 | 162 | 163 | 1.063 | 500 | 100 |
| Example 9 | 4.51 | 2.6 | 104 | 169 | 184 | 1.239 | 2400 | 50 |
| Example 10 | 10.14 | 3.5 | 107 | 173 | 183 | 1.242 | 2400 | 50 |
| Example 11 | 3.05 | 1.9 | 101 | 161 | 180 | 1.233 | 2400 | 50 |
| Comparative Example 1 | 2.05 | 1.4 | 101 | 120 | 134 | 1.235 | 3000 | — |
| Comparative Example 2 | 0.51 | 1.5 | 98 | 125 | 144 | 1.193 | 2220 | — |

TABLE 2-continued

| Table 2 Unit | Δa % | FWHM deg. | $\varepsilon_r$ — | $d_{33,f}$ pC/N | $d_{33,f}/\varepsilon_0\varepsilon_r \times 10^{-3}$ V · m/N | c1/a1 — | T1 nm | TL nm |
|---|---|---|---|---|---|---|---|---|
| Comparative Example 3 | 0.26 | 0.9 | 91 | 118 | 146 | 1.122 | 3800 | — |
| Comparative Example 4 | −0.26 | 0.8 | 105 | 116 | 125 | 1.062 | 1690 | — |
| Comparative Example 5 | 0.00 | 1.2 | 94 | 113 | 136 | 1.051 | 500 | — |
| Comparative Example 6 | 13.48 | 6.2 | 97 | 110 | 128 | 1.058 | 2410 | 30 |
| Comparative Example 7 | 7.08 | 5.6 | 151 | 145 | 108 | 1.059 | 2130 | 30 |
| Comparative Example 8 | 2.01 | 3.9 | 150 | 80 | 60 | 1.037 | 2050 | 30 |

Comparative Examples 9 to 11

The temperature (film-forming temperature) inside the vacuum chamber in the first film formation step of each of Comparative Examples 9 to 11 was maintained at a temperature shown in Table 3 below. The lower layer of Comparative Example 10 was not formed. That is, the first piezoelectric layer of Comparative Example 10 was formed directly on the surface of the first electrode layer.

A piezoelectric thin film element of each of Comparative Examples 9 to 11 was produced by the same method as in Example 1 except for the above matters.

Measurement for the first electrode layer of each of Comparative Examples 9 to 11 was performed by the same method as in Example 1. In all cases of Comparative Examples 9 to 11, the (002) planes of the Pt crystal constituting the first electrode layer were oriented in the normal direction of the surface of the first electrode layer, and the (200) planes of the Pt crystal were oriented in the in-plane direction of the surface of the first electrode layer.

Analysis and measurement for the piezoelectric thin film of each of Comparative Examples 9 to 11 were performed by the same method as in Example 1.

In all cases of Comparative Examples 9 to 11, the composition of the first piezoelectric layer was consistent with the composition of the first target.

In all cases of Comparative Examples 9 and 11, the (001) planes of the lower crystal constituting the lower layer were oriented in the normal direction of the surface of the first piezoelectric layer.

In all cases of Comparative Examples 9 to 11, the first piezoelectric layer consisted of the tetragonal crystal 1 of the perovskite-type oxide.

In all cases of Comparative Examples 9 to 11, the (001) planes of the tetragonal crystal 1 were oriented preferentially in the normal direction of the surface of the first piezoelectric layer.

aL, a1, Δa, and FWHM of each of Comparative Examples 9 to 11 were values shown in Table 3 below.

c1/a1 of each of Comparative Examples 9 to 11 was a value shown in Table 4 below.

The piezoelectric properties of the piezoelectric thin film of each of Comparative Examples 9 to 11 were evaluated by the same method as in Example 1. $\varepsilon_r$, $d_{33,f}$, and $d_{33,f}/\varepsilon_r\varepsilon_0$ of each of Comparative Examples 9 to 11 were shown in Table 4 below.

TABLE 3

| Table 3 Unit | $E^A$ — | $E^{B1}$ — | $E^{B2}$ — | α — | β — | x1 — | y1 — | z1 — | a1 Å | aL Å | Δa % | Lower layer — | First oriented plane — | FWHM deg. | Film-forming temperature ° C. |
|---|---|---|---|---|---|---|---|---|---|---|---|---|---|---|---|
| Example 1 | K | Ti | None | 0.5 | 0 | 0.15 | 0.80 | 0.05 | 3.81 | 3.99 | 4.51 | BaTiO₃ | (001) | 2.3 | 450 |
| Comparative Example 9 | K | Ti | None | 0.5 | 0 | 0.15 | 0.80 | 0.05 | 3.81 | 3.99 | 4.51 | BaTiO₃ | (001) | 1.6 | 600 |
| Comparative Example 10 | K | Ti | None | 0.5 | 0 | 0.15 | 0.80 | 0.05 | 3.81 | 3.91 | 2.56 | None | (001) | 5.4 | 380 |
| Comparative Example 11 | K | Ti | None | 0.5 | 0 | 0.15 | 0.80 | 0.05 | 3.81 | 4.45 | 14.38 | MnO | (001) | 5.8 | 380 |

TABLE 4

| Table 4 Unit | $\Delta a$ % | FWHM deg. | $\varepsilon_r$ — | $d_{33,f}$ pC/N | $d_{33,f}/\varepsilon_0\varepsilon_r \times 10^{-3}$ V·m/N | c1/a1 — | T1 nm | TL nm |
|---|---|---|---|---|---|---|---|---|
| Example 1 | 4.51 | 2.3 | 111 | 165 | 168 | 1.240 | 3000 | 30 |
| Comparative Example 9 | 4.51 | 1.6 | 102 | 100 | 111 | 1.210 | 3000 | 30 |
| Comparative Example 10 | 2.56 | 5.4 | 200 | 120 | 68 | 1.190 | 3000 | — |
| Comparative Example 11 | 14.38 | 5.8 | 250 | 90 | 41 | 1.205 | 3000 | 30 |

Comparative Example 12

The oxygen partial pressure in the vacuum chamber in the first film formation step of Comparative Example 12 was maintained at 0.01 Pa. The thickness T1 of the first piezoelectric layer of Comparative Example 12 was adjusted to a value shown in Table 6 below.

A piezoelectric thin film element of Comparative Example 12 was produced by the same method as in Example 1 except for the above matters.

Measurement for the first electrode layer of Comparative Example 12 was performed by the same method as in Example 1. In the case of Comparative Example 12, the (002) planes of the Pt crystal constituting the first electrode layer were oriented in the normal direction of the surface of the first electrode layer, and the (200) planes of the Pt crystal were oriented in the in-plane direction of the surface of the first electrode layer.

Analysis and measurement for the piezoelectric thin film of Comparative Example 12 were performed by the same method as in Example 1.

In the case of Comparative Example 12, the composition of the piezoelectric thin film was not consistent with the composition of the first target in terms of oxygen content.

Since the piezoelectric thin film of Comparative Example 12 did not have sufficient crystalline orientation, the FWHM of Comparative Example 12 could not be specified.

aL, a1, and $\Delta a$ of Comparative Example 12 were values shown in Table 5 below.

c1/a1 of Comparative Example 12 was a value shown in Table 6 below.

The piezoelectric properties of the piezoelectric thin film of Comparative Example 12 were evaluated by the same method as in Example 1. $\varepsilon_r$, $d_{33,f}$, and $d_{33,f}/\varepsilon_r\varepsilon_0$ of Comparative Example 12 were shown in Table 6 below.

TABLE 5

| Table 5 Unit | $E^A$ — | $E^{B1}$ — | $E^{B2}$ — | $\alpha$ — | $\beta$ — | x1 — | y1 — | z1 — | a1 Å | aL Å | $\Delta a$ % | Lower layer — | First oriented plane — | FWHM deg. |
|---|---|---|---|---|---|---|---|---|---|---|---|---|---|---|
| Example 1 | K | Ti | None | 0.5 | 0 | 0.15 | 0.80 | 0.05 | 3.81 | 3.99 | 4.51 | BaTiO$_3$ | (001) | 2.3 |
| Comparative Example 12 | K | Ti | None | 0.5 | 0 | 0.15 | 0.80 | 0.05 | 3.96 | 3.99 | 0.75 | BaTiO$_3$ | None | — |

TABLE 6

| Table 6 Unit | $\Delta a$ % | FWHM deg. | $\varepsilon_r$ — | $d_{33,f}$ pC/N | $d_{33,f}/\varepsilon_0\varepsilon_r \times 10^{-3}$ V · m/N | c1/a1 — | T1 nm | TL nm |
|---|---|---|---|---|---|---|---|---|
| Example 1 | 4.51 | 2.3 | 111 | 165 | 168 | 1.240 | 3000 | 30 |
| Comparative Example 12 | 0.75 | — | 358 | 53.0 | 17 | — | 2650 | 30 |

Example 12

In the production process of the piezoelectric thin film element of Example 12, the intermediate layer was not formed. In the production process of the piezoelectric thin film element of Example 12, the first electrode layer consisting of crystalline SrRuO₃ was formed directly on the entire surface of the crystalline substrate. The thickness of the first electrode layer of Example 9 was 200 nm.

A piezoelectric thin film element of Example 12 was produced by the same method as in Example 1 except for the above matters.

Measurement for the first electrode layer of Example 12 was performed by the same method as in Example 1. In the case of Example 12, the crystal plane of the first electrode layer was not oriented in the in-plane direction of the surface of the first electrode layer. That is, in the case of Example 12, there was the in-plane orientation of the crystal of the first electrode layer.

Analysis and measurement for the piezoelectric thin film of Example 12 were performed by the same method as in Example 1.

The composition of the first piezoelectric layer in Example 12 was consistent with the composition of the first target.

The (001) planes of the lower crystal constituting the lower layer of Example 12 were oriented in the normal direction of the surface of the first piezoelectric layer.

The first piezoelectric layer of Example 12 consisted of the tetragonal crystal 1 of the perovskite-type oxide.

The (001) planes of the tetragonal crystal 1 of Example 12 were oriented preferentially in the normal direction of the surface of the first piezoelectric layer.

aL, a1, $\Delta a$, and FWHM of Example 12 were values shown in Table 7 below.

c1/a1 of Example 12 was a value shown in Table 8 below.

The piezoelectric properties of the piezoelectric thin film of Example 12 were evaluated by the same method as in Example 1. $\varepsilon_r$, $d_{33,f}$, and $d_{33,f}/\varepsilon_r\varepsilon_0$ of Example 12 were shown in Table 8 below.

TABLE 7

| Table 7 Unit | $E^A$ — | $E^{B1}$ — | $E^{B2}$ — | $\alpha$ — | $\beta$ — | x1 — | y1 — | z1 — | a1 Å | aL Å | $\Delta a$ % | Lower layer — | First oriented plane — | FWHM deg. | In-plane orientation — |
|---|---|---|---|---|---|---|---|---|---|---|---|---|---|---|---|
| Example 1 | K | Ti | None | 0.5 | 0 | 0.15 | 0.80 | 0.05 | 3.81 | 3.99 | 4.51 | BaTiO₃ | (001) | 2.3 | Present |
| Example 12 | K | Ti | None | 0.5 | 0 | 0.15 | 0.80 | 0.05 | 3.81 | 3.99 | 4.51 | BaTiO₃ | (001) | 3.2 | Absent |

TABLE 8

| Table 8 Unit | $\Delta a$ % | FWHM deg. | $\varepsilon_r$ — | $d_{33,f}$ pC/N | $d_{33,f}/\varepsilon_0\varepsilon_r \times 10^{-3}$ V · m/N | c1/a1 — | T1 nm | TL nm |
|---|---|---|---|---|---|---|---|---|
| Example 1 | 4.51 | 2.3 | 111 | 165 | 168 | 1.240 | 3000 | 30 |
| Example 12 | 4.51 | 3.2 | 127 | 169 | 150 | 1.155 | 3000 | 30 |

Examples 13 to 19

The composition of the lower layer of each of Examples 13 to 19 is shown in Table 9 below.

In the cases of Examples 13 to 19, by performing the above-described second film formation step (PLD method) in the vacuum chamber, a second piezoelectric layer was formed on the entire surface of the lower layer. The repetition frequency f2 of pulse laser light in the second film formation step was adjusted to 20 Hz. The oxygen partial pressure in the vacuum chamber in the second film formation step was maintained at 1 Pa. The temperature (film-forming temperature) inside the vacuum chamber in the second film formation step was maintained at 460° C. The thickness T2 of the second piezoelectric layer was adjusted to a value shown in Table 11 below.

The composition of the second target used in the second film formation step of each of Examples 13 to 19 is represented by Chemical Formula 2' below. $E^A$, $E^{B1}$, and $E^{B2}$ in Chemical Formula 2' of each of Examples 13 to 19 were elements shown in Table 9 below. x2, y2, and z2 in Chemical Formula 2' of each of Examples 13 to 19 were values shown in Table 10 below.

$$x2(Bi_{1-\alpha}E^A{}_\alpha)(E^{B1}{}_{1-\beta}E^{B2}{}_\beta)O_3 - y2BiFeO_3 - z2Bi(Fe_{0.5}Ti_{0.5})O_3 \quad (2')$$

In the cases of Examples 13 to 19, the first piezoelectric layer was formed on the entire surface of the second piezoelectric layer by the first film formation step subsequent to the second film formation step. That is, the piezoelectric thin film of each of Examples 13 to 19 consisted of the lower layer, the second piezoelectric layer directly stacked on the lower layer, and the first piezoelectric layer directly stacked on the second piezoelectric layer. The thickness T1 of the first piezoelectric layer of each of Examples 13 to 19 was adjusted to a value shown in Table 11 below. The composition of the first target used in the first film formation step of each of Examples 13 to 19 is represented by Chemical Formula 1' above. $E^A$, $E^{B1}$, and $E^{B2}$ in Chemical Formula 1' of each of Examples 13 to 19 were elements shown in Table 9 below. $\alpha$, $\beta$, x1, y1, and z1 in Chemical Formula 1' of each of Examples 13 to 19 were values shown in Table 9 below.

In all cases of Examples 13 to 19, $E^A$, $E^{B1}$, $E^{B2}$, $\alpha$, and $\beta$ are common to those of the first piezoelectric layer (first target) and the second piezoelectric layer (second target).

A piezoelectric thin film element of each of Examples 13 to 19 was produced by the same method as in Example 1 except for the above matters.

Measurement for the first electrode layer of each of Examples 13 to 19 was performed by the same method as in Example 1. In all cases of Examples 13 to 19, the (002) planes of the Pt crystal constituting the first electrode layer were oriented in the normal direction of the surface of the first electrode layer, and the (200) planes of the Pt crystal were oriented in the in-plane direction of the surface of the first electrode layer.

Analysis and measurement for the piezoelectric thin film of each of Examples 13 to 19 were performed by the same method as in Example 1. The piezoelectric thin film of each of Examples 13 to 19 had the following features.

The composition of the first piezoelectric layer was consistent with the composition of the first target.

The (001) planes of the lower crystal constituting the lower layer were oriented in the normal direction of the surface of the first piezoelectric layer.

The first piezoelectric layer consisted of the tetragonal crystal 1 of the perovskite-type oxide.

The (001) planes of the tetragonal crystal 1 were oriented preferentially in the normal direction of the surface of the first piezoelectric layer.

The composition of the second piezoelectric layer was consistent with the composition of the second target.

The second piezoelectric layer consisted of a tetragonal crystal 2 of a perovskite-type oxide.

(001) planes of the tetragonal crystal 2 were oriented preferentially in the normal direction of the surface of the first piezoelectric layer. That is, the orientation degree of the (001) plane of the tetragonal crystal 2 in the normal direction of the surface of the first piezoelectric layer was 90% or more. As described above, the orientation degree of the (001) plane of the tetragonal crystal 2 is represented as $100 \times I_{2(001)}/(I_{2(001)}+I_{2(110)}+I_{2(111)})$. The crystal plane of the tetragonal crystal 2 oriented preferentially in the normal direction of the surface of the first piezoelectric layer is described as "second oriented plane".

aL, a1, $\Delta a$, and FWHM of each of Examples 13 to 19 were values shown in Table 9 below.

c1/a1 of the tetragonal crystal 1 of each of Examples 13 to 19 was a value shown in Table 11 below.

c2/a2 of the tetragonal crystal 2 of each of Examples 13 to 19 was a value shown in Table 11 below.

$I_1/(I_1+I_2)$ of each of Examples 13 to 19 was a value shown in Table 11 below. The definition of $I_1/(I_1+I_2)$ is as described above.

The piezoelectric properties of the piezoelectric thin film of each of Examples 13 to 19 were evaluated by the same method as in Example 1. $\varepsilon_r$, $d_{33,f}$, and $d_{33,f}/\varepsilon_r\varepsilon_0$ of each of Examples 13 to 19 were shown in Table 11 below. The reciprocal space map of Example 13 is shown in

TABLE 9

| Table 9 Unit | $E^A$ — | $E^{B1}$ — | $E^{B2}$ — | $\alpha$ — | $\beta$ — | x1 — | y1 — | z1 — | a1 Å | aL Å | $\Delta a$ % | Lower layer — | First oriented plane — | FWHM deg. | f1 Hz |
|---|---|---|---|---|---|---|---|---|---|---|---|---|---|---|---|
| Example 1 | K | Ti | None | 0.5 | 0 | 0.15 | 0.80 | 0.05 | 3.81 | 3.99 | 4.51 | BaTiO$_3$ | (001) | 2.3 | 10 |
| Example 13 | K | Ti | None | 0.5 | 0 | 0.10 | 0.85 | 0.05 | 3.78 | 3.99 | 5.26 | BaTiO$_3$ | (001) | 2 4 | 10 |
| Example 14 | Ag | Mg | Ti | 0.5 | 0.5 | 0.15 | 0.05 | 0.80 | 3.87 | 3.99 | 3.01 | BaTiO$_3$ | (001) | 3.1 | 10 |
| Example 15 | K | Zn | Zr | 0.5 | 0.5 | 0.80 | 0.15 | 0.05 | 3.88 | 4.24 | 8.49 | TiN | (001) | 2.0 | 10 |
| Example 16 | K | Zn | Ti | 0.5 | 0.5 | 0.30 | 0.65 | 0.05 | 3.78 | 3.99 | 5.26 | BaTiO$_3$ | (001) | 2.9 | 10 |
| Example 17 | None | Al | None | 0 | 0 | 0.20 | 0.10 | 0.70 | 3.92 | 4.24 | 7.55 | TiN | (001) | 3.5 | 10 |

TABLE 9-continued

| Table 9 Unit | $E^A$ — | $E^{B1}$ — | $E^{B2}$ — | α — | β — | x1 — | y1 — | z1 — | a1 Å | aL Å | Δa % | Lower layer — | First oriented plane — | FWHM deg. | f1 Hz |
|---|---|---|---|---|---|---|---|---|---|---|---|---|---|---|---|
| Example 18 | Na | Ni | Ti | 0.5 | 0.5 | 0.25 | 0.15 | 0.60 | 3.88 | 4.24 | 8.49 | TiN | (001) | 2.7 | 10 |
| Example 19 | None | Mg | Ti | 0 | 0.5 | 0.15 | 0.35 | 0.50 | 3.75 | 3.99 | 6.02 | $BaTiO_3$ | (001) | 4.1 | 10 |

TABLE 10

| | x2 | y2 | z2 | Second oriented plane | f2 |
|---|---|---|---|---|---|
| Unit | — | — | — | — | Hz |
| Example 1 | — | — | — | (001) | — |
| Example 13 | 0.10 | 0.85 | 0.05 | (001) | 20 |
| Example 14 | 0.10 | 0.10 | 0.80 | (001) | 20 |
| Example 15 | 0.70 | 0.20 | 0.10 | (001) | 20 |
| Example 16 | 0.25 | 0.70 | 0.05 | (001) | 20 |
| Example 17 | 0.15 | 0.15 | 0.70 | (001) | 20 |
| Example 18 | 0.20 | 0.20 | 0.60 | (001) | 20 |
| Example 19 | 0.10 | 0.40 | 0.50 | (001) | 20 |

TABLE 11

| Table 11 Unit | Δa % | FWHM deg. | $\varepsilon_r$ — | $d_{33f}$ pC/N | $d_{33f}/\varepsilon_0\varepsilon_r \times 10^{-3}$ V·m/N | c1/a1 — | T1 nm | TL nm | c2/a2 — | T2 nm | T1 + T2 nm | $I_1/(I_1 + I_2)$ |
|---|---|---|---|---|---|---|---|---|---|---|---|---|
| Example 1 | 4.51 | 2.3 | 111 | 165 | 168 | 1.240 | 3000 | 30 | — | 0 | 3000 | 1.00 |
| Example 13 | 5.26 | 2.4 | 109 | 174 | 180 | 1.201 | 2500 | 30 | 1.065 | 30 | 2530 | 0.93 |
| Example 14 | 3.01 | 3.1 | 102 | 158 | 175 | 1.204 | 2000 | 30 | 1.033 | 250 | 2250 | 0.92 |
| Example 15 | 8.49 | 2.0 | 90 | 173 | 217 | 1.135 | 3350 | 30 | 1.016 | 290 | 3640 | 0.91 |
| Example 16 | 5.26 | 2.9 | 88 | 173 | 222 | 1.127 | 4750 | 30 | 1.108 | 200 | 4950 | 0.97 |
| Example 17 | 7.55 | 3.5 | 98 | 149 | 172 | 1.100 | 1590 | 30 | 1.027 | 120 | 1710 | 0.95 |
| Example 18 | 8.49 | 2.7 | 101 | 155 | 173 | 1.071 | 510 | 30 | 1.014 | 50 | 560 | 0.99 |
| Example 19 | 6.02 | 4.1 | 99 | 162 | 185 | 1.066 | 2850 | 30 | 1.036 | 10 | 2860 | 0.96 |

INDUSTRIAL APPLICABILITY

For example, the piezoelectric thin film according to an aspect of the present invention may be applied to a piezoelectric transducer, a piezoelectric actuator, and a piezoelectric sensor.

REFERENCE SIGNS LIST

1: tetragonal crystal 1, 2: tetragonal crystal 2, 3A: first piezoelectric layer, 3B: second piezoelectric layer, 4: second electrode layer, 5: intermediate layer, 6: lower layer, 6c: crystal (lower crystal) contained in lower layer, 7: first electrode layer, 8: crystalline substrate, 10, 10a: piezoelectric thin film element, 10b: ultrasonic transducer, $D_N$: normal direction of surface of crystalline substrate, dn: normal direction of surface of first piezoelectric layer, P: piezoelectric thin film, uc: unit cell of perovskite structure, uc1: unit cell of tetragonal crystal 1, uc2: unit cell of tetragonal crystal 2, ucL: unit cell of crystal contained in lower layer.

What is claimed is:

1. A piezoelectric thin film comprising: a lower layer; and a first piezoelectric layer directly or indirectly stacked on the lower layer, wherein the first piezoelectric layer contains a tetragonal crystal 1 of a perovskite-type oxide, a (001) plane of the tetragonal crystal 1 is oriented in a normal direction of a surface of the first piezoelectric layer, a spacing of (100) planes of the tetragonal crystal 1 is a1, a spacing of (100) planes of a crystal contained in the lower layer is aL, a lattice mismatch rate between the first piezoelectric layer and the lower layer is defined as $100 \times (aL-a1)/a1$, the lattice mismatch rate is from 3.0% to 12.1%, a rocking curve of diffracted X-rays of the (001) plane of the tetragonal crystal 1 is measured in an out-of-plane direction of the surface of the first piezoelectric layer, and a full width at half maximum of the rocking curve is from 1.9° to 5.5°.

2. The piezoelectric thin film according to claim 1, wherein the aL is from 3.92 Å to 4.29 Å.

3. The piezoelectric thin film according to claim 1, wherein a (001) plane of the crystal contained in the lower layer is oriented in the normal direction of the surface of the first piezoelectric layer.

4. The piezoelectric thin film according to claim 1, wherein the crystal contained in the lower layer is at least one crystal selected from the group consisting of a cubic crystal, a tetragonal crystal, a rhombohedral crystal, a pseudo-cubic crystal, and a pseudo-tetragonal crystal.

5. The piezoelectric thin film according to claim 1, wherein the crystal contained in the lower layer contains at least one compound of barium titanate and titanium nitride.

6. The piezoelectric thin film according to claim 1, wherein a thickness of the lower layer is from 10 nm to 350 nm.

7. The piezoelectric thin film according to claim 1, wherein a spacing of the (001) planes of the tetragonal crystal 1 is c1, and c1/a1 is from 1.050 to 1.250.

8. The piezoelectric thin film according to claim 1, wherein the tetragonal crystal 1 contains bismuth, iron, an element $E^B$, and oxygen, and the element $E^B$ is at least one element selected from the group consisting of magnesium, aluminum, zirconium, titanium, nickel, and zinc.

9. The piezoelectric thin film according to claim 1, wherein the tetragonal crystal 1 is represented by Chemical Formula 1 below, $E^A$ in Chemical Formula 1 below is at least one element selected from the group consisting of Na, K, and Ag, $E^B$ in Chemical Formula 1 below is at least one element selected from the group consisting of Mg, Al, Zr, Ti, Ni, and Zn, x1 in Chemical Formula 1 below is from 0.10 to 0.90, y1 in Chemical Formula 1 below is from 0.05 to 0.85, z1 in Chemical Formula 1 below is from 0.05 to 0.85, x1+y1+z1 is 1.00, and $\alpha$ in Chemical Formula 1 below is 0.00 or more and less than 1.00:

$$x1(Bi_{1-\alpha}E^A\alpha)E^BO_3\text{-}y1BiFeO_3\text{-}z1Bi(Fe_{0.5}Ti_{0.5})O_3 \qquad (1).$$

10. The piezoelectric thin film according to claim 1, comprising a second piezoelectric layer, wherein the second piezoelectric layer is disposed between the lower layer and the first piezoelectric layer, the second piezoelectric layer contains a tetragonal crystal 2 of a perovskite-type oxide, a (001) plane of the tetragonal crystal 2 is oriented in the normal direction of the surface of the first piezoelectric layer, a spacing of the (001) planes of the tetragonal crystal 1 is c1, a spacing of the (001) planes of the tetragonal crystal 2 is c2, a spacing of (100) planes of the tetragonal crystal 2 is a2, and c2/a2 is smaller than c1/a1.

11. The piezoelectric thin film according to claim 10, wherein the c2/a2 is from 1.010 to 1.110.

12. The piezoelectric thin film according to claim 10, wherein a peak intensity of diffracted X-rays of the (001) plane of the tetragonal crystal 1 is $I_1$, a peak intensity of diffracted X-rays of the (001) plane of the tetragonal crystal 2 is $I_2$, and $I_1/(I_1+I_2)$ is 0.90 or more and less than 1.00.

13. The piezoelectric thin film according to claim 10, wherein the tetragonal crystal 2 contains bismuth, iron, an element $E^B$, and oxygen, and the element $E^B$ is at least one element selected from the group consisting of magnesium, aluminum, zirconium, titanium, nickel, and zinc.

14. The piezoelectric thin film according to claim 10, wherein the tetragonal crystal 2 is represented by Chemical Formula 2 below, $E^A$ in Chemical Formula 2 below is at least one element selected from the group consisting of Na, K, and Ag, $E^B$ in Chemical Formula 2 below is at least one element selected from the group consisting of Mg, Al, Zr, Ti, Ni, and Zn, x2 in Chemical Formula 2 below is from 0.10 to 0.85, y2 in Chemical Formula 2 below is from 0.10 to 0.85, z2 in Chemical Formula 2 below is from 0.05 to 0.80, x2+y2+z2 is 1.00, and $\alpha$ in Chemical Formula 2 below is 0.00 or more and less than 1.00:

$$x2(Bi_{1-\alpha}E^A{}_\alpha)E^BO_3\text{-}y2BiFeO_3\text{-}z2Bi(Fe_{0.5}Ti_{0.5})O_3 \qquad (2).$$

15. The piezoelectric thin film according to claim 10, wherein a thickness of the second piezoelectric layer is from 10 nm to 300 nm.

16. A piezoelectric thin film device comprising the piezoelectric thin film according to claim 1.

17. The piezoelectric thin film device according to claim 16, comprising:

a crystalline substrate; and an electrode layer stacked on the crystalline substrate, wherein the lower layer is directly stacked on the electrode layer, an intermediate layer is disposed between the crystalline substrate and the electrode layer, and the intermediate layer contains $ZrO_2$ and $Y_2O_3$.

18. The piezoelectric thin film element device according to claim 16, comprising an electrode layer, wherein the lower layer is directly stacked on the electrode layer, the electrode layer contains a platinum crystal, a (002) plane of the platinum crystal is oriented in a normal direction of a surface of the electrode layer, and a (200) plane of the platinum crystal is oriented in an in-plane direction of the surface of the electrode layer.

19. A piezoelectric transducer comprising the piezoelectric thin film device according to claim 16.

\* \* \* \* \*